United States Patent
Yamazaki et al.

(10) Patent No.: US 6,717,179 B1
(45) Date of Patent: *Apr. 6, 2004

(54) SEMICONDUCTOR DEVICE AND SEMICONDUCTOR DISPLAY DEVICE

(75) Inventors: Shunpei Yamazaki, Tokyo (JP); Jun Koyama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/540,639

(22) Filed: Mar. 31, 2000

Related U.S. Application Data

(62) Division of application No. 09/132,633, filed on Aug. 11, 1998.

(30) Foreign Application Priority Data

| Aug. 19, 1997 | (JP) | 9-238927 |
| Aug. 20, 1997 | (JP) | 9-240506 |
| Apr. 27, 1998 | (JP) | 10-132748 |
| Apr. 27, 1998 | (JP) | 10-132749 |
| May 25, 1998 | (JP) | 10-161363 |
| May 25, 1998 | (JP) | 10-161366 |

(51) Int. Cl.[7] ............................................. H01L 21/20
(52) U.S. Cl. ........................ 257/59; 257/72; 349/43; 345/206
(58) Field of Search ..................... 257/59, 72, 66; 349/42, 43, 54; 345/87, 205, 904, 206, 92, 98; 348/189, 191

(56) References Cited

U.S. PATENT DOCUMENTS

| 4,065,781 A | 12/1977 | Gutknecht ................ 357/23 |
| 4,394,688 A | 7/1983 | Iida et al. ................. 358/160 |
| 4,409,724 A | 10/1983 | Tasch, Jr. et al. ............. 29/571 |
| 4,766,477 A | 8/1988 | Nakagawa et al. ........... 357/59 |
| 4,774,556 A | 9/1988 | Fujii et al. |

(List continued on next page.)

FOREIGN PATENT DOCUMENTS

| JP | 5-82787 | 4/1993 |
| JP | 07-130652 | 5/1995 |
| JP | 07-135318 | 5/1995 |
| JP | 07-321339 | 12/1995 |
| JP | 08-078329 | 3/1996 |
| JP | 08-148694 | 6/1996 |
| JP | 10-294280 | 11/1998 |
| JP | 11-345767 | 12/1999 |
| JP | 11-354442 | 12/1999 |

OTHER PUBLICATIONS

Shimokawa, R. et al, "Characterization of High–Efficiency Cast–Si Solar Cell Wafers by MBIC Measurement," Japanese Journal of Applied Physics, vol. 27, No. 5, pp. 751–758, May 1988.

(List continued on next page.)

Primary Examiner—Minh Loan Tran
(74) Attorney, Agent, or Firm—Cook, Alex, McFarron, Manzo, Cummings & Mehler, Ltd.

(57) ABSTRACT

A semiconductor device includes a control circuit for carrying out gamma correction of a supplied signal, and a memory for storing data used in the gamma correction. The control circuit and the memory are constituted by TFTs, and are integrally formed on the same insulating substrate. A semiconductor display device includes a pixel region in which a plurality of TFTs are arranged in matrix; a driver for switching the plurality of TFTs; a picture signal supply source for supplying a picture signal; a control circuit for carrying out gamma correction of the picture signal; and a memory for storing data used in the gamma correction of the picture signal. The plurality of TFTs, the driver, the control circuit, and the memory are integrally formed on the same insulating substrate.

48 Claims, 21 Drawing Sheets

U.S. PATENT DOCUMENTS

| | | |
|---|---|---|
| 4,780,424 A | 10/1988 | Holler et al. |
| 4,861,730 A | 8/1989 | Hsia et al. |
| 4,929,988 A | 5/1990 | Yoshikawa |
| 5,017,977 A | 5/1991 | Richardson |
| 5,021,848 A | 6/1991 | Chiu |
| 5,053,842 A | 10/1991 | Kojima |
| 5,071,782 A | 12/1991 | Mori |
| 5,078,498 A | 1/1992 | Kadakia et al. |
| 5,146,426 A | 9/1992 | Mukherjee et al. |
| 5,188,976 A | 2/1993 | Kume et al. ............... 435/52 |
| 5,202,576 A | 4/1993 | Liu et al. |
| 5,260,797 A | 11/1993 | Muraji et al. ............. 358/231 |
| 5,350,937 A | 9/1994 | Yamazaki et al. |
| 5,430,320 A | 7/1995 | Lee ........................ 257/412 |
| 5,452,019 A | 9/1995 | Fukuda et al. ........... 348/655 |
| 5,481,317 A | 1/1996 | Hieda ...................... 348/751 |
| 5,481,320 A | 1/1996 | Konuma et al. .......... 348/751 |
| 5,539,459 A | 7/1996 | Bullitt et al. ............. 348/254 |
| 5,541,138 A | 7/1996 | Yamazaki et al. |
| 5,569,615 A | 10/1996 | Yamazaki et al. |
| 5,633,519 A | 5/1997 | Yamazaki et al. |
| 5,642,129 A | 6/1997 | Zavracky et al. ......... 345/100 |
| 5,643,826 A | 7/1997 | Ohtani et al. .............. 437/88 |
| 5,648,277 A | 7/1997 | Zhang et al. ............... 437/21 |
| 5,666,159 A | 9/1997 | Parulski et al. ........... 348/211 |
| 5,705,829 A | 1/1998 | Miyanaga et al. .......... 257/66 |
| 5,753,544 A | 5/1998 | Cho et al. ................. 438/166 |
| 5,784,129 A | 7/1998 | Konuma et al. .......... 348/739 |
| 5,789,292 A | 8/1998 | Yamazaki et al. |
| 5,789,762 A | 8/1998 | Koyama et al. ............ 257/66 |
| 5,793,344 A * | 8/1998 | Koyama ..................... 345/87 |
| 5,818,083 A | 10/1998 | Ito ........................... 257/321 |
| 5,847,411 A | 12/1998 | Morii ........................ 257/64 |
| 5,895,935 A | 4/1999 | Yamazaki et al. .......... 257/59 |
| 5,923,962 A | 7/1999 | Ohtani et al. ............. 438/150 |
| 5,926,562 A | 7/1999 | Hyodo et al. ............. 382/167 |
| 5,933,199 A | 8/1999 | Yoon ........................ 348/674 |
| 5,962,872 A | 10/1999 | Zhang et al. ............... 257/66 |
| 5,965,915 A | 10/1999 | Yamazaki et al. |
| 5,977,562 A | 11/1999 | Hirakata et al. ............ 257/72 |
| 5,982,427 A | 11/1999 | Hunt et al. ................ 348/254 |
| 5,982,462 A | 11/1999 | Nakano et al. ............. 349/43 |
| 6,006,313 A | 12/1999 | Fukumoto .................. 711/211 |
| 6,093,937 A | 7/2000 | Yamazaki et al. .......... 257/59 |
| 6,128,648 A | 10/2000 | Chen et al. |
| 6,140,667 A | 10/2000 | Yamazaki et al. |
| 6,160,271 A | 12/2000 | Yamazaki et al. |
| 6,268,617 B1 | 7/2001 | Hirakata et al. ............ 257/72 |
| 6,285,042 B1 | 9/2001 | Ohtani et al. |
| 6,335,541 B1 | 1/2002 | Ohtani et al. |
| 6,335,716 B1 * | 1/2002 | Yamazaki et al. ........... 345/92 |

OTHER PUBLICATIONS

English abstract re Japanese patent application No. 7–130652, published May 19, 1995.

English abstract re Japanese patent application No. 7–135318, published May 23, 1995.

English abstract re Japanese patent application No. 7–321339, published Dec. 8, 1995.

English abstract re Japanese patent application No. 8–078329, published Mar. 22, 1996.

English abstract re Japanese patent application No. 10–294280, published Nov. 4, 1998.

English abstract re Japanese patent application No. 11–345767, published Dec. 14, 1999.

English abstract re Japanese patent application No. 11–354442, published Dec. 24, 1999.

U.S. patent application No. 09/095,027 (pending) to Ohtani et al filed Jun. 9, 1998, including specification, claims, abstract, drawings and PTO filing receipt; and allowed claims.

U.S. patent application No. 09/539,828 (pending) to Yamazaki et al. including PTO filing receipt, specification, claims, abstract, and drawings.

U.S. patent application No. 09/540,357 (pending) to Yamazaki et al. including PTO filing receipt, specification, claims, abstract, and drawings.

1) JP 5–82787 English abstract.

1) JP 08–148694 English abstract.

1) U.S. patent application No. 09/138,691 (pending) to Yamazaki et al, filed Aug. 24, 1998, including specification, claims, abstract, drawings and PTO filing receipt.

2) U.S. patent application No. 09/144,538 (pending) including specification, claims and drawings.

* cited by examiner

FORMING STEP OF FLOATING GATE

MEMORY ELEMENT | PIXEL

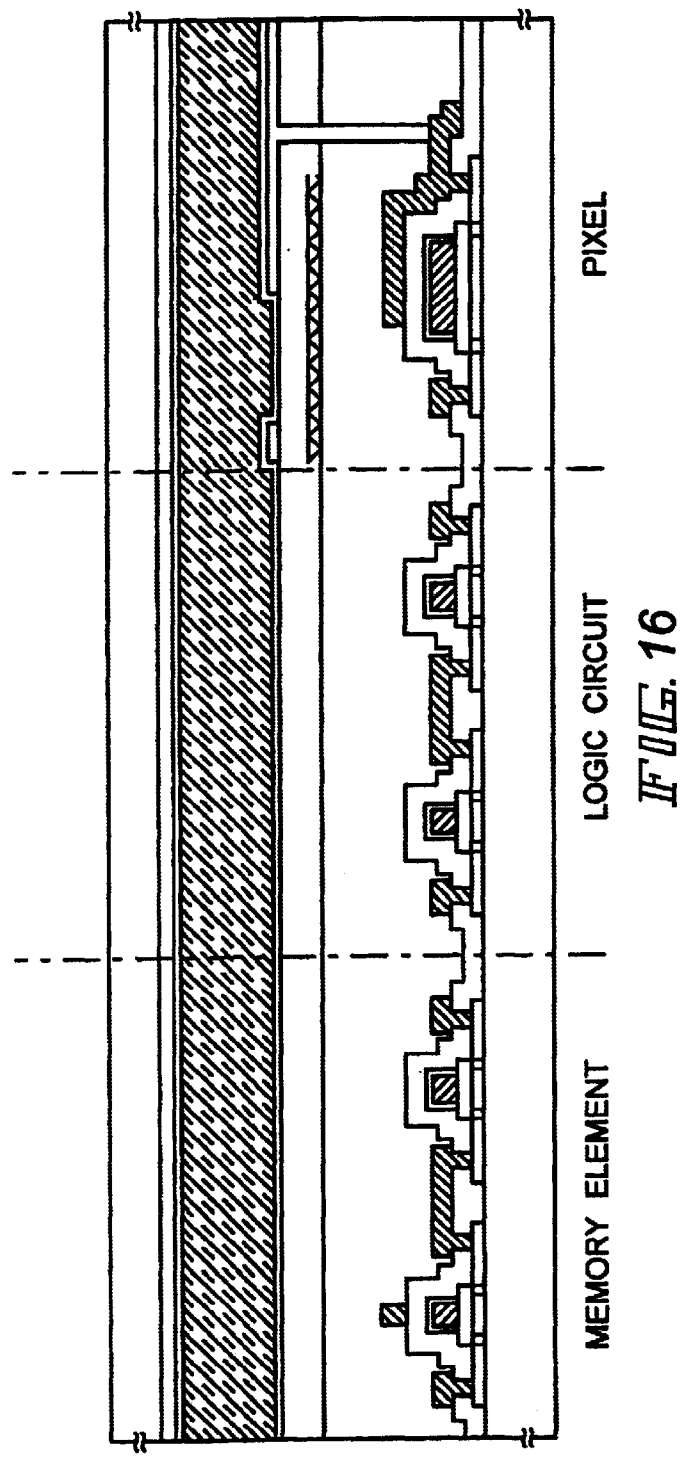
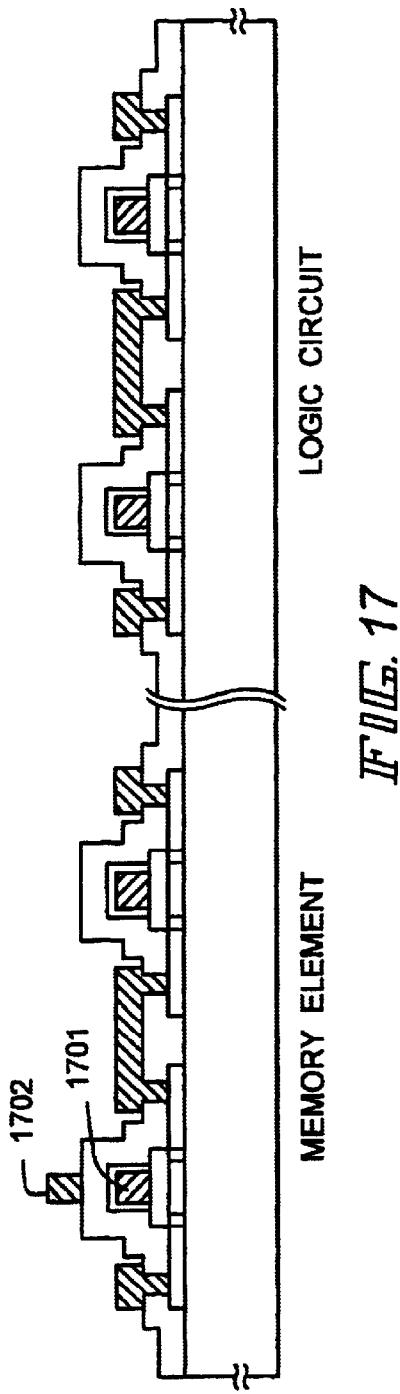

5nm

5nm

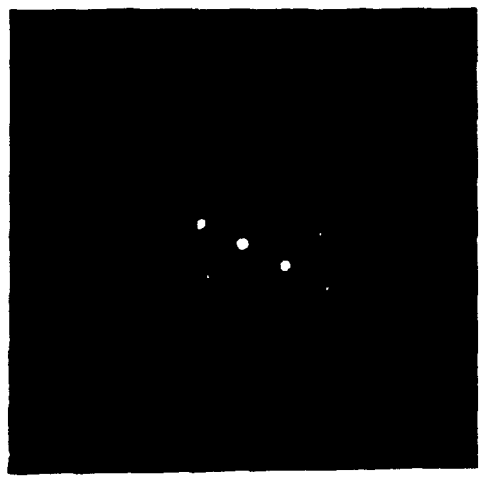
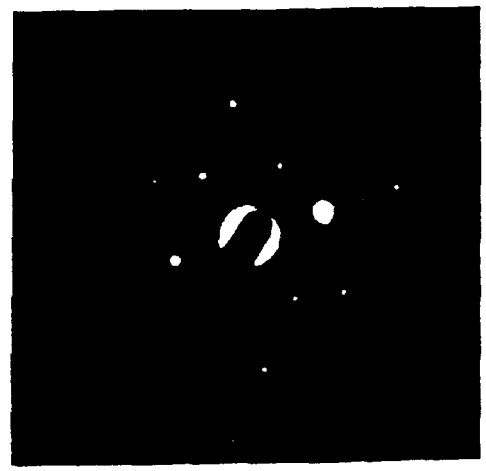
Fig. 22A  Fig. 22B
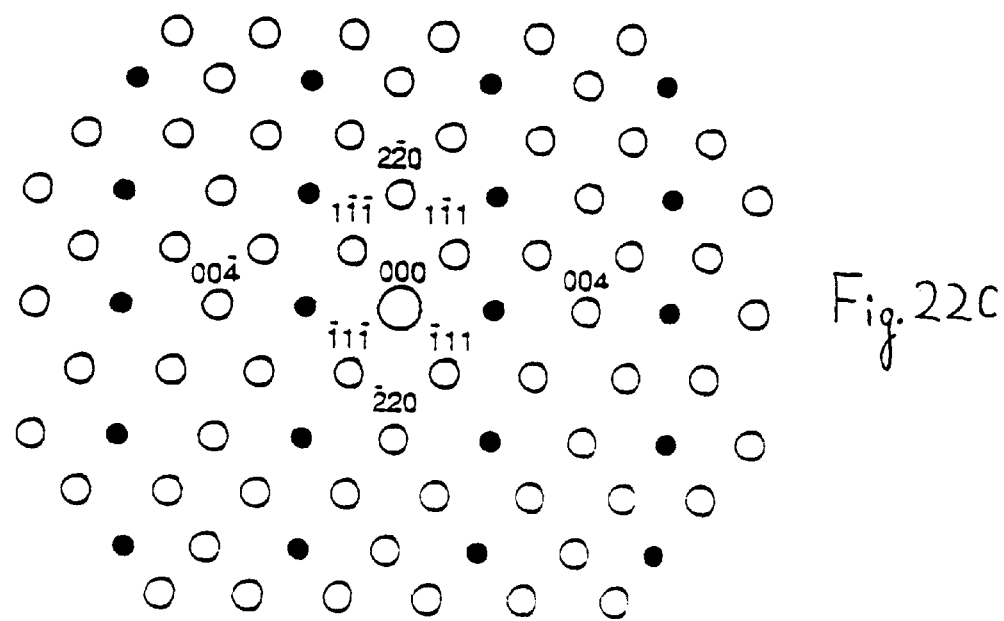
Fig. 22C

2 μm

2 μm

SEMICONDUCTOR DEVICE AND SEMICONDUCTOR DISPLAY DEVICE

This application is a division of Ser. No. 09/132,633 filed Aug. 11, 1998.

BACKGROUND OF THE INVENTION

1. Field of the Invention

The present invention relates to a semiconductor device and a semiconductor display device. Particularly, the present invention relates to a semiconductor device in which a nonvolatile memory for storing data and other logic circuits are integrally formed on an insulating substrate by using an SOI (Silicon On Insulator) technique. Moreover, the present invention relates to a semiconductor display device in which pixels and peripheral circuits such as a driving circuit and a memory are integrally formed on an insulating substrate by using the SOI technique.

2. Description of the Related Art

In recent years, a technique for manufacturing a semiconductor device, such as a thin film transistor (hereinafter referred to as a TFT), in which a semiconductor thin film is formed on an inexpensive glass substrate has been rapidly developed. The reason is that the demand for an active matrix type liquid crystal display panel (liquid crystal panel) has increased.

The active matrix type liquid crystal panel is constructed such that a TFT is disposed for each of several tens to several millions of pixel regions arranged in matrix, and an electric charge going in and out of each pixel electrode is controlled by the switching function of the TFT.

FIG. 14 shows a conventional active matrix type liquid crystal display device. As shown in FIG. 14, the conventional active matrix type liquid crystal display device includes a source line side driver 1401, a gate line side driver 1402, a plurality of pixel TFTs 1403 arranged in matrix, and a picture signal line 1404.

The source line side driver and the gate line side driver include a shift register, a buffer circuit, and the like, and are integrally formed on the same substrate as an active matrix circuit in recent years.

Thin film transistors using amorphous silicon formed on a glass substrate are disposed in the active matrix circuit.

There is also known a structure in which quartz is used for a substrate and a thin film transistor is formed of a polycrystalline silicon film. In this case, both a peripheral driving circuit and an active matrix circuit are constituted by thin film transistors formed on the quartz substrate.

There is also known a technique in which a thin film transistor using a crystalline silicon film is formed on a glass substrate by using a technique such as laser annealing. When this technique is used, an active matrix circuit and a peripheral driving circuit can be integrated on a glass substrate.

In the structure as shown in FIG. 14, a picture signal supplied to the picture signal line 1404 is selected by a signal from a shift register circuit of the source line side driver (shift register for horizontal scanning). Then the designated picture signal is supplied to the corresponding source signal line.

The picture signal supplied to the source signal line is selected by a thin film transistor of a pixel and is written into the designated pixel electrode.

The thin film transistor of the pixel is operated by a selection signal supplied from a shift register of the gate line side driver (shift register for vertical scanning) through a gate signal line.

This operation is sequentially repeated at suitable timing by signals from the shift register of the source line side driver and signals from the shift register of the gate line side driver, so that information is sequentially written into the respective pixels arranged in matrix.

In recent years, an active matrix type liquid crystal display device has been often used for a note-sized personal computer. In the personal computer, a multi-gradation liquid crystal display device is required to realize such functions that plural pieces of software are concurrently started up or a picture from a digital camera is taken in and is processed.

Moreover, the demand for a liquid crystal projector which can project a television signal such as a high-definition television signal and can meet a large screen, has increased. In this case as well, the quality of a supplied picture depends on the degree of the fineness of gradation display.

Like this, for the purpose of providing a high quality picture, it is important to what degree the gradation display can be made fine. As a method of gradation display, there are a case (analog gradation) of supplying an analog signal such as a video signal or a television signal to a source line and a case (digital gradation) of supplying a digital signal such as a data signal from a personal computer or the like.

In the analog gradation, as described above, an analog picture signal to be supplied to the picture signal line is sequentially selected by a signal from the source driver, and the designated picture signal is supplied to the corresponding source line.

In the digital gradation, a digital signal to be supplied to the picture signal line is sequentially selected, and after the selected signal is D/A converted, the designated picture signal is supplied to the corresponding source line.

In the case of the liquid crystal display device, even when any gradation display is used, there is a relation between the voltage (V) applied to a liquid crystal and the strength of transmitted light as indicated by a dotted line in FIG. 15. However, it is assumed that the liquid crystal display device uses a TN (twisted nematic) mode and a normally white mode in which the device becomes in a light state when a voltage is not applied.

As is understood from FIG. 15 as well, since there is a nonlinear relation between the voltage applied to the liquid crystal and the strength of the transmitted light, it is difficult to make gradation display according to an applied voltage.

In order to compensate the above, a means as gamma correction is adopted. In the gamma correction, a picture signal is gained and correction is made so that the strength of transmission light is linearly changed according to an applied voltage. By this gamma correction, excellent gradation display can be obtained. The relation between the applied voltage and the strength of the transmitted light in the case where the gamma correction is carried out is indicated by a solid line in FIG. 15.

However, in order to apply the gamma correction to a picture signal, an IC circuit is additionally required so that a circuit must be provided on the outside of the liquid crystal panel. Thus, it has been actually impossible to miniaturize a product.

SUMMARY OF THE INVENTION

In view of the above, an object of the present invention is to provide a semiconductor display device, particularly to provide a liquid crystal display device, which is able to carry out excellent gradation display and is able to be miniaturized.

According to an aspect of the present invention, a semiconductor device comprises a memory for storing data, and a logic circuit for controlling the data, wherein the memory and the logic circuit are constituted by TFTs, and are integrally formed on the same insulating substrate. The above object is achieved by this structure.

The memory may be a nonvolatile memory.

The nonvolatile memory may include a plurality of FAMOS type TFTs.

The thickness of an active layer of the TFT may be 10 to 100 nm.

According to another aspect of the present invention, a semiconductor device comprises a memory for storing data, and a logic circuit for controlling the data, wherein the memory and the logic circuit are constituted by TFTs, and are integrally formed on the same insulating substrate, and wherein the thickness of an active layer of the TFT is 10 to 100 nm so that it becomes easy to carry out impact ionization. The above object is achieved by this structure.

The memory may be a nonvolatile memory.

The nonvolatile memory may include a plurality of FAMOS type TFTs.

According to still another aspect of the present invention, a semiconductor device comprises a control circuit for carrying out gamma correction of a supplied signal, and a memory for storing data used in the gamma correction, wherein the control circuit and the memory are constituted by TFTs, and are integrally formed on the same insulating substrate. The above object is achieved by this structure.

The memory may be a nonvolatile memory.

The nonvolatile memory may include a plurality of FAMOS type TFTs.

The signal may be a digital signal.

The signal may be an analog signal and the semiconductor device may further comprise a conversion circuit for converting the analog signal to a digital signal.

According to still another aspect of the present invention, a semiconductor display device comprises a pixel region where a plurality of TFTs are arranged in matrix; a driver for switching the plurality of TFTs; a picture signal supply source for supplying a picture signal; a control circuit for carrying out gamma correction of the picture signal; and a memory for storing data used in the gamma correction of the picture signal, wherein the plurality of TFTs, the driver, the control circuit, and the memory are integrally formed on the same insulating substrate. The above object is achieved by this structure.

The memory may be a nonvolatile memory.

The nonvolatile memory may include a plurality of FAMOS type TFTs.

The picture signal may be a digital signal.

The picture signal may be an analog signal, and the semiconductor display device may further comprise a conversion circuit for converting the analog signal to a digital signal.

The thickness of an active layer of the TFT may be 10 to 100 nm.

According to still another aspect of the present invention, a semiconductor display device comprises a pixel region where a plurality of TFTs are arranged in matrix; a driver for switching the plurality of TFTs; a digital picture signal supply source for supplying a digital picture signal; a conversion circuit for converting the digital picture signal to an analog signal; a control circuit for carrying out gamma correction of the digital picture signal; and a memory for storing data used in the gamma correction of the digital picture signal, wherein the conversion circuit includes a plurality of voltage lines for supplying different voltages to source lines of the plurality of TFTs, and wherein the plurality of TFTs, the driver, the control circuit, and the memory are integrally formed on the same insulating substrate. The above object is achieved by this structure.

The memory may be a nonvolatile memory.

The nonvolatile memory may include a plurality of FAMOS type TFTs.

The thickness of an active layer of the TFT may be 10 to 100 nm.

BRIEF DESCRIPTION OF THE DRAWINGS

In the accompanying drawings:

FIG. 16 is a sectional view showing a liquid crystal display device of the present invention;

FIG. 17 is a sectional view showing a memory and a logic circuit of the present invention;

FIGS. 22A to 22C are photographs and a model view showing electron diffraction patterns;

DETAILED DESCRIPTION OF THE PREFERRED EMBODIMENTS

Preferred embodiments of the present invention will now be described with reference to the accompanying drawings.

Embodiment 1

In this embodiment, a semiconductor device in which a memory for storing data is integrally formed on an insulating substrate by using an SOI (Silicon On Insulator) technique will be described. Among semiconductor devices, especially a liquid crystal display device will be described. Moreover, a liquid crystal display device in which the above technique is used for a memory for storing data used in gamma correction of picture data will be described.

Figure 19:
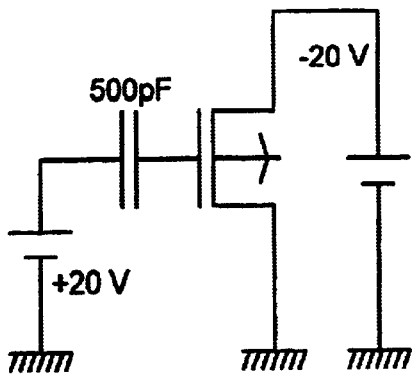
FIG. 19 is a circuit diagram for confirming a memory effect of a P-channel TFT.
Figure 20A:
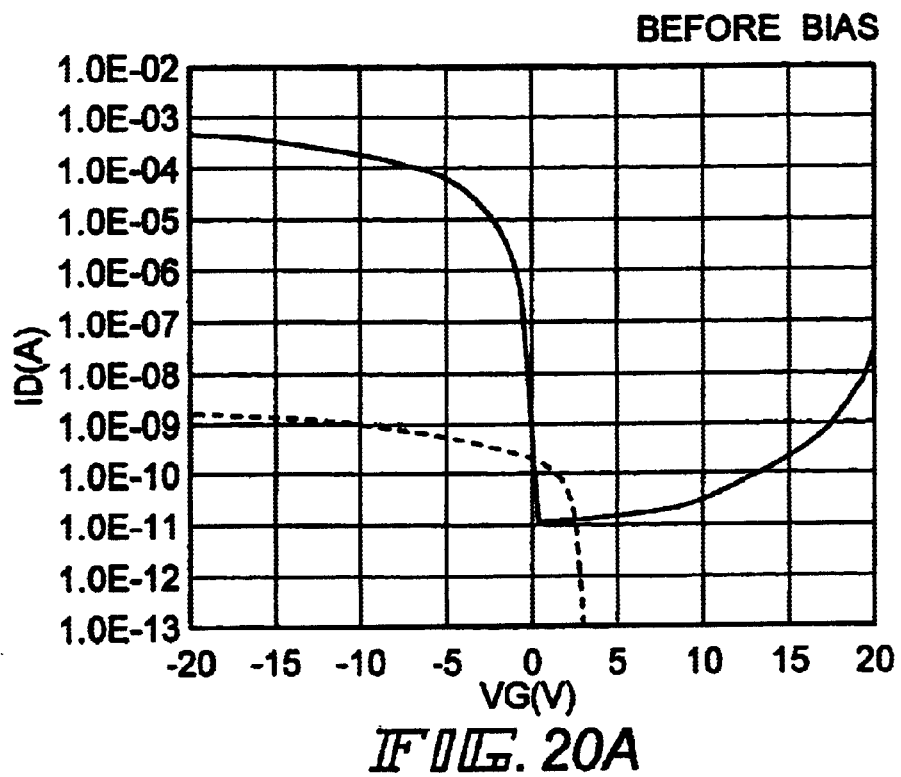
FIGS. 20A and 20B are views showing occurrence of the memory effect of the P-channel TFT.
Figure 20B:
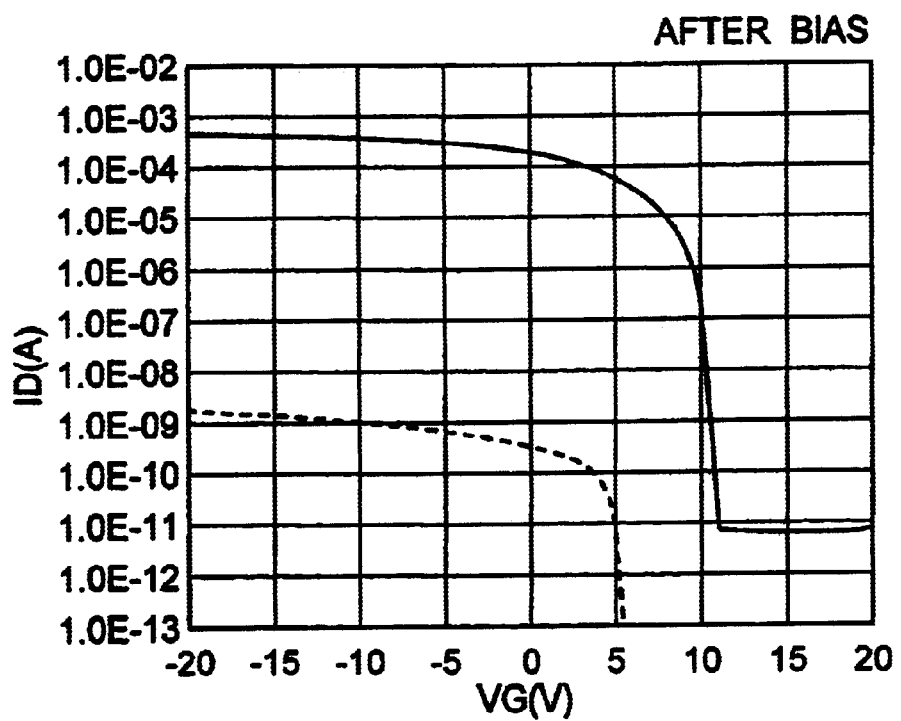

First, the present inventors confirmed a memory effect of a P-channel TFT described in this embodiment (FIGS. 20A and 20B). As shown in FIG. 19, an external capacitance is connected to a P-channel TFT, and a high voltage is applied through the capacitance. Bias conditions at this time were such that a voltage between the source and drain is –20 V, and a voltage between the gate and source is +20 V.

Next, when the characteristics were measured in this state, the result was as shown in FIG. 20B. The measurement result of an initial state is shown in FIG. 20A. From these graphs, the variation of a threshold value of a TFT was found.

Figure 1:
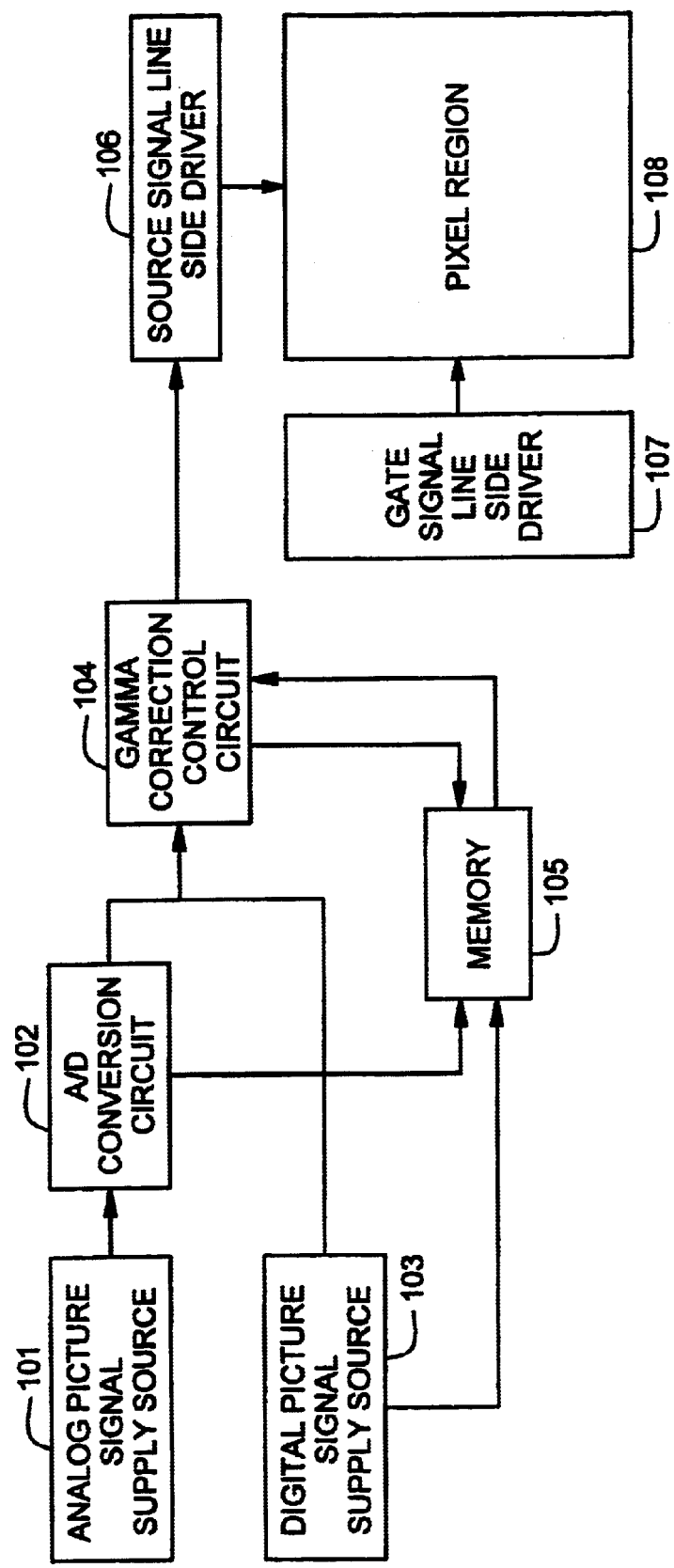
FIG. 1 is a schematic structural view of a liquid crystal display device of the present invention.

The present inventors provided a floating gate to this P-channel TFT to develop a memory. Reference will be made to FIG. 1. FIG. 1 is a schematic structural view of an active matrix type liquid crystal display device of this embodiment. Reference numeral 101 denotes an analog picture signal supply source which supplies an analog signal such as a video signal or a television signal. Reference numeral 102 denotes an A/D conversion circuit which converts an analog picture signal supplied from an analog picture signal supply source 101 to a digital signal. Reference numeral 103 denotes a digital signal supply source which supplies a digital picture signal from a computer or the like. In this embodiment, it is assumed that a picture signal is supplied from the analog picture signal supply source 101 or the digital picture signal supply source 103. There may be provided such a switch as to carry out switching so that a picture signal is supplied from the analog picture signal supply source 101 or the digital picture signal supply source 103 according to necessity.

Reference numeral 104 denotes a gamma correction circuit, and 105 denotes a 4 k-bit memory. Based on gamma correction data stored in the memory 105, the gamma correction control circuit carries out gamma correction of a digital picture signal supplied from the A/D conversion circuit 102 or the digital picture signal supply source, and transmits the corrected signal to a source signal side driver 106. In this embodiment, although the 4 K-bit memory is used as the memory 105, the storage capacity of the memory 105 is not limited to this value. A memory having storage capacitance of not larger than 4 k bits or not less than 4 K bits may be used as the memory 105.

The source signal line side driver 106 is constituted by a shift register, a buffer, a digital decoder, a D/A converter, and the like. A gate signal line side driver 107 is constituted by a shift register, a buffer, and the like. The source signal line side driver 106 and the gate signal line side driver 107 are provided with other circuits according to necessity.

Reference numeral 108 denotes a pixel region which is constituted by a plurality of thin film transistors (TFTs) arranged in matrix. The pixel region 108 is also called a pixel matrix circuit. In this embodiment, the number of pixels was made 1024×768 in length and breadth. Although explanation will be made with respect to a liquid crystal display device having the foregoing number of the pixels in this embodiment, the present invention is not limited to the liquid crystal display device having the foregoing number of the pixels.

In the liquid crystal display device of this embodiment, any of the pixel region 108, the source signal line side driver 106, the gate signal line side driver 107, the gamma correction control circuit 104, and the memory 105 are constituted by TFTs, and are integrally formed on a substrate. The A/D conversion circuit 102 may be mounted as an IC chip on the substrate, or may be integrally formed by TFTs on the substrate. Other peripheral circuit may also be integrally formed by TFTs on the substrate. Moreover, the other peripheral circuit may be mounted as an IC chip on the substrate.

Figure 2:
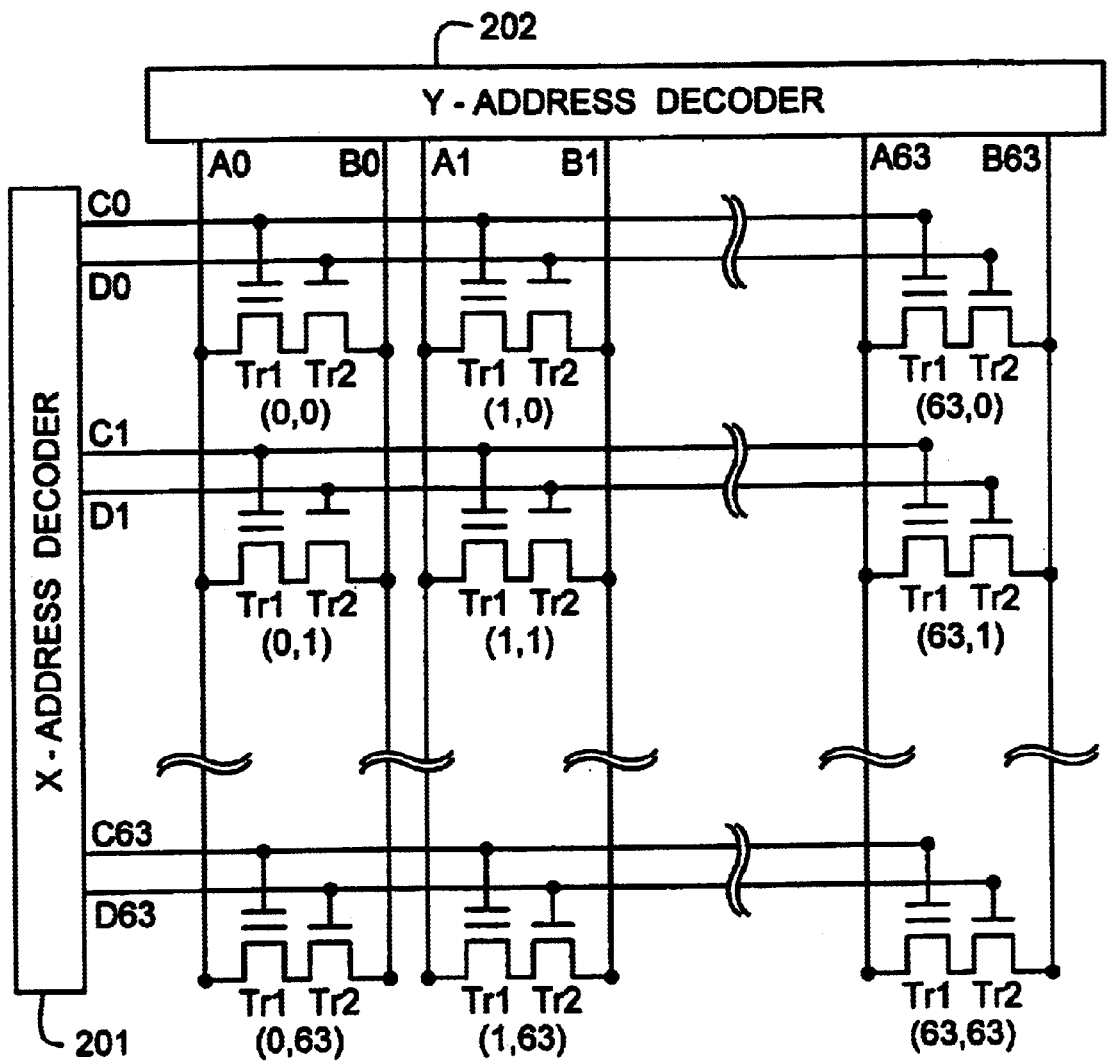
FIG. 2 is a structural view of a memory for storing gamma correction data for a liquid crystal display device of the present invention.

Next, the operation of the liquid crystal display device of this embodiment will be described. Reference will be made to FIG. 2. FIG. 2 is a schematic structural view showing the memory 105 of this embodiment. The memory 105 of this embodiment is constituted by a plurality of memory elements, and X- and Y-address decoders 201 and 202. As shown in FIG. 2, a storage element (memory element) for recording each bit information is constituted by two TFTs. One is a P-channel FAMOS (Floating gate Avalanche injection MOS) type nonvolatile memory element Tr1 having a floating gate and the other is an N-channel switching element Tr2. In the two TFTs Tr1 and Tr2, the drain electrodes are connected in series with each other, and this series connection circuit constitutes a one-bit memory element. Memory elements of 64×64 in length and breadth, each of which is made of the foregoing one-bit memory element, are arranged in matrix. Since each memory element can store one-bit information, the memory 105 in this embodiment has a storage capacity of 4096 bits (=about 4K bits).

Both ends of each of the memory elements arranged in the respective columns are connected to signal lines A0, B0 to A63, B63. Gate electrodes of the respective memory elements arranged in the respective rows are connected to signal lines C0, D0 to C63, D63. As shown in FIG. 2, the memory elements constituting the memory 105 are denoted by characters such as (0, 0), (1, 0), (63, 63).

The respective signal lines A0, B0 to A63, B63, and C0, D0 to C63, D63 are connected to the X-address decoder 201 and the Y-address decoder 202, respectively. The address of the memory element is specified by the X-address decoder 201 and the Y-address decoder 202 and writing or reading of data is carried out.

Next, the operation of the memory 105 will be described with reference to a memory element (1, 1) as an example.

First, in the case where data are written into the memory element (1, 1), a high voltage of 50 V is applied to the signal line C1. Further, a voltage of 5 V is also applied to the signal line D1. When the signal line B1 is connected to the GND, and a voltage of −5 V is applied to the signal line A1, an electric charge is stored in the floating gate of the TFT Tr1.

Next, in the case where data are read from the memory element (1, 1), a voltage of 0 V is applied to the signal line C1, and a voltage of 5 V is applied to the signal line D1. When the signal line B1 is connected to the GND, a stored signal is read from the signal line A1.

The above operation is summarized in the following table.

TABLE 1

|  | A1 (V) | B1 (V) | C1 (V) | D1 (V) |
|---|---|---|---|---|
| At writing | 0/−5 | GND | 50 | 5 |
| At reading | — | GND | 0 | 5 |

Incidentally, the storage content stored in the memory element can be erased by irradiation of X-rays, ultraviolet rays, electron beams, or the like to the memory 105.

The memory 105 stores data for gamma correction of a digital picture signal. This is data intrinsic to the liquid crystal display device, and is written into the memory 105 at the production.

Figure 3:
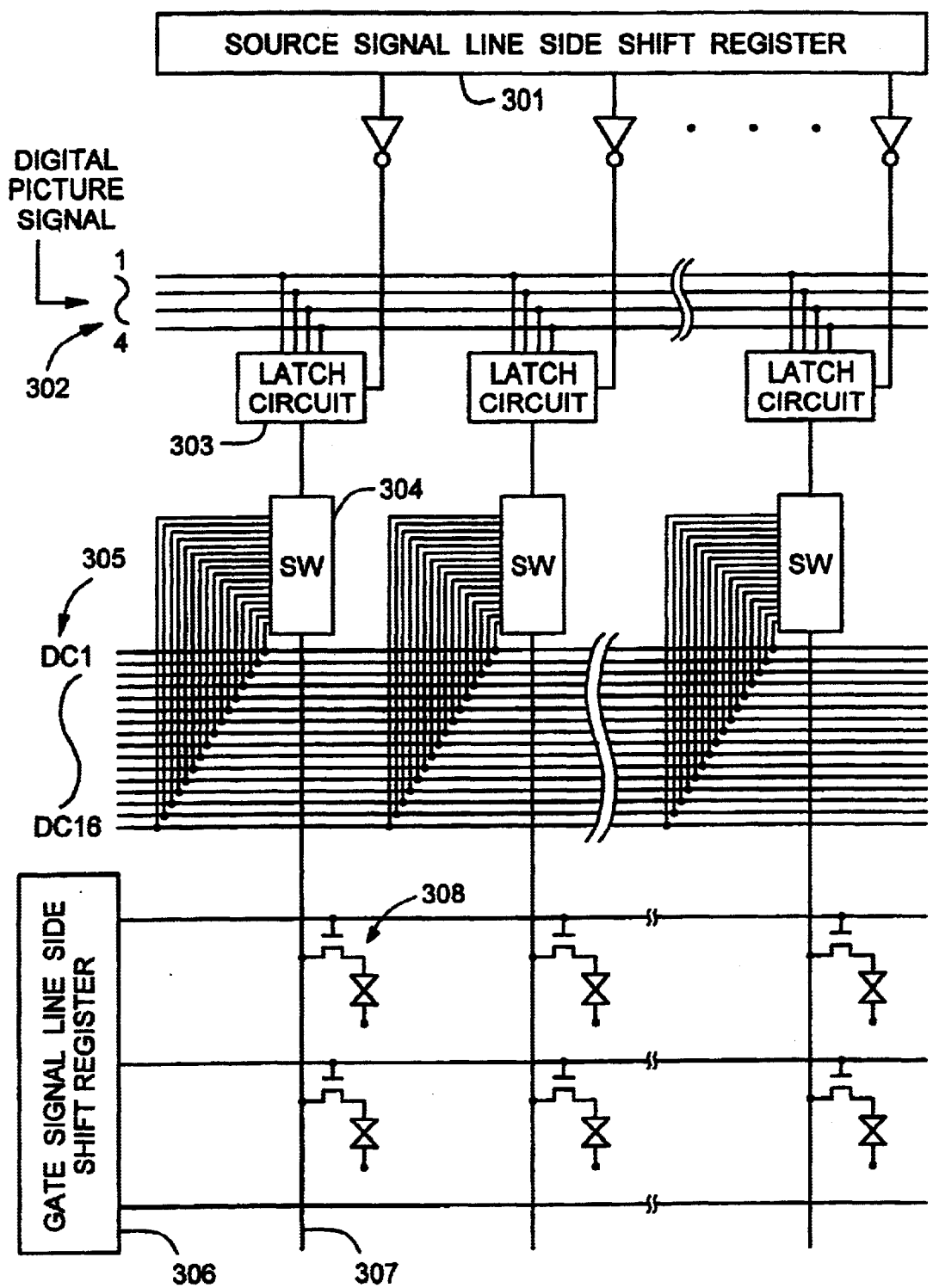
FIG. 3 is a structural view of a driver and a pixel region of a liquid crystal display device of the present invention.

Next, reference will be made to FIG. 3. FIG. 3 shows the source signal line side driver, the gate signal line side driver, and the pixel region of the liquid crystal display device of this embodiment. Reference numeral 301 denotes a source signal line side shift register, and 302 denotes signal lines for supplying a digital signal inputted into the source signal line side driver. In this embodiment, in order to carry out 16 gradation display, the signal lines 302 are designed so that 4-bit data can be processed. Reference numeral 303 denotes latch circuits each of which selects a signal supplied to the signal lines 302 by a signal from the source signal line side shift register 301 and temporarily stores the selected signal. Reference numeral 304 denotes switching circuits each of which selects any one of voltage lines DC1 to DC16 of gradation voltage lines 305 according to a signal supplied from the latch circuit 303, and supplies to a source signal line 307. When picture information corresponding to one line is stored in the group of the latch circuits 303, the picture information stored in the group of the latch circuits 303 is transmitted to the switching circuits 304 at the same time.

A corresponding pixel TFT 308 is selected by a signal voltage corresponding to a designated gradation supplied to a source signal line and a signal from the gate signal line side shift register 306. In this way, picture information corresponding to the designated gradation is written into the respective pixels.

Next, manufacturing steps of the liquid crystal display device of this embodiment will be described.

In this embodiment, an example in which a plurality of TFTs are formed on a substrate having an insulating surface, and a matrix circuit of the pixel region and a peripheral circuit including a driver circuit are monolithically formed, will be described with reference to FIGS. 4 to 7. In this embodiment, explanation will be made to a P-channel FAMOS circuit having a floating gate for storing gamma correction data, a switching element therefor, and a pixel TFT. Incidentally, a CMOS circuit which is typically used for a peripheral circuit such as a driver can be similarly manufactured. In this embodiment, although manufacturing steps of a circuit in which a P-channel TFT and an N-channel TFT respectively include one gate electrode will be described, a circuit including a plurality of gate electrodes such as a double gate type can also be manufactured in the same way.

Reference will be made to FIGS. 4A to 4D. First, a quartz substrate 401 is prepared as a substrate having an insulating surface. Instead of the quartz substrate, a silicon substrate on which a thermal oxidation film is formed may be used.

Moreover, such a method may be adopted that an amorphous silicon film is temporarily formed on a quartz substrate and the film is completely thermally oxidized to form an insulating film. In addition, a quartz substrate or a ceramic substrate, each having a silicon nitride film formed as an insulating film, may be used.

Reference numeral 402 denotes an amorphous silicon film, and adjustment is made so that a final film thickness (film thickness taken a film decrease after thermal oxidation into consideration) becomes 10 to 100 nm (preferably 15 to 45 nm). In the film formation, it is important to thoroughly manage the concentration of impurities in the film. When the film thickness is adjusted to 10 to 100 nm, it is possible to facilitate the impact ionization to a FAMOS type TFT constituting a memory element, to lower an applied voltage, and to facilitate injection of electric charges.

In this embodiment, management is made so that the concentration of each of C (carbon), N (nitrogen), O (oxygen), and S (sulfur), which are typical impurities in the amorphous silicon film 402, becomes less than $5\times10^{18}$ atoms/cm$^3$ (preferably not larger than $1\times10^{18}$ atoms/cm$^3$). It is because if the concentration of any one of the impurities exceeds the above value, the impurity may have a bad influence on the film at crystallization and may cause the film quality to be degraded after the crystallization.

The concentration of hydrogen in the amorphous silicon film 402 is also a very important parameter, and it appears that as the hydrogen content is made low, a film with superior crystallinity is obtained. Thus, it is preferable to form the amorphous silicon film 402 by a low pressure CVD method. A plasma CVD method may be used if the film formation condition is optimized.

Next, the amorphous silicon film 402 is crystallized. A technique disclosed in Japanese Patent Unexamined Publication No. Hei. 7-130652 is used as a means for crystallization. Although any means of embodiment 1 and embodiment 2 disclosed in the publication may be used, in this embodiment, it is preferable to use the technical content (described in detail in Japanese Patent Unexamined Publication No. Hei. 8-78329) set forth in the embodiment 2 of the publication.

According to the technique disclosed in Japanese Patent Unexamined Publication No. Hei. 8-78329, a mask insulating film 403 for selecting an added region of a catalytic element is first formed. The mask insulating film 403 has a plurality of openings for adding the catalytic element. The positions of the openings can determine the positions of crystal regions.

Figure 4A:
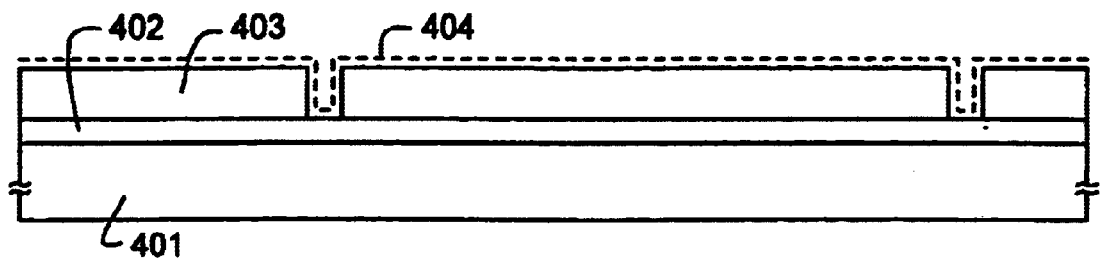
FIGS. 4A to 4D are views showing manufacturing steps of a liquid crystal display device of the present invention.

A solution containing nickel (Ni) as the catalytic element for promoting the crystallization of the amorphous silicon film is applied by a spin coating method to form a Ni containing layer 404. As the catalytic element, cobalt (Co), iron (Fe), palladium (Pd), platinum (Pt), copper (Cu), gold (Au), germanium (Ge), or the like may be used other than nickel (FIG. 4A).

As the adding step of the above-mentioned catalytic element, an ion implantation method or a plasma doping method using a resist mask may also be used. In this case, since it becomes easy to decrease an occupied area of an added region and to control a growth distance of a lateral growth region, the method becomes an effective technique when a minute circuit is formed.

Next, after the adding step of the catalytic element is ended, dehydrogenating is carried out at about 450° C. for 1 hour, and then a heat treatment is carried out in an inert gas atmosphere, a hydrogen atmosphere, or an oxygen atmosphere at a temperature of 500 to 700° C. (typically 550 to 650° C.) for 4 to 24 hours to crystallize the amorphous silicon film 402. In this embodiment, a heat treatment is carried out in a nitrogen atmosphere, at 570° C., and for 14 hours.

Figure 4B:
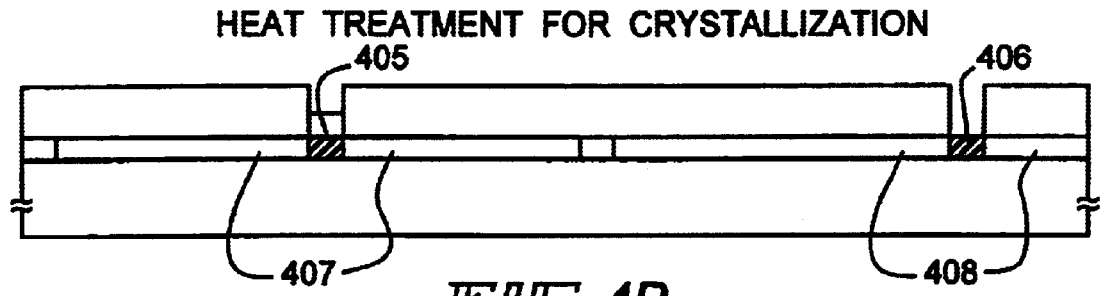

At this time, crystallization of the amorphous silicon film 402 proceeds first from nuclei produced in regions 405 and 406 added with nickel, and crystal regions 407 and 408 grown almost parallel to the surface of the substrate 401 are formed. The crystal regions 407 and 408 are respectively referred to as a lateral growth region. The lateral growth region has such an advantage that the total crystallinity is superior since respective crystals are gathered in a comparatively uniform state (FIG. 4B).

Incidentally, even in the case where the technique set forth in embodiment 1 of the above-mentioned Japanese Patent Unexamined Publication No. Hei. 7-130652 is used, a region which can be called a lateral growth region is microscopically formed. However, since the production of nuclei occurs irregularly on the surface, it is difficult to control crystal grain boundaries.

Figure 4C:
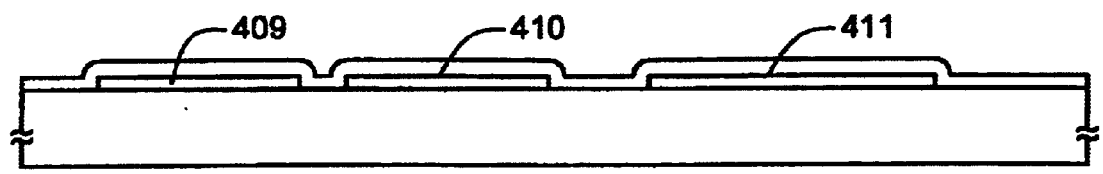

After the heat treatment for crystallization is ended, the mask insulating film 403 is removed and patterning is carried out, so that island-like semiconductor layers (active layers) 409, 410, and 411 made of the lateral growth regions 407 and 408 are formed (FIG. 4C).

Reference numeral 409 denotes the active layer of a P-type TFT constituting a CMOS circuit, 410 denotes the active layer for an N-type TFT constituting the CMOS circuit, and 411 denotes the active layer for an N-type TFT (pixel TFT) for constituting a pixel matrix circuit.

After the active layers 409, 410 and 411 are formed, a gate insulating film 412 made of an insulating film containing silicon is formed thereon.

Figure 4D:
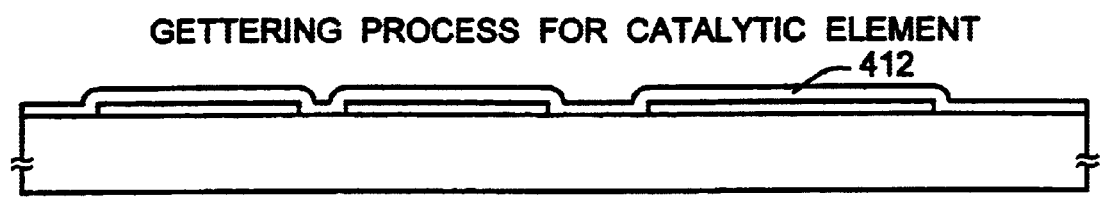

Next, as shown in FIG. 4D, a heat treatment (gettering process for the catalytic element) for removing or reducing the catalytic element (nickel) is carried out. In this heat treatment, a halogen element is made contained in a processing atmosphere and the gettering effect for a metallic element by the halogen element is used.

In order to sufficiently obtain the gettering effect by the halogen element, it is preferable to carry out the above heat treatment at a temperature exceeding 700° C. If the temperature is not higher than 700° C., it becomes difficult to decompose a halogen compound in the processing atmosphere, so that there is a fear that the gettering effect can not be obtained.

Thus, in this embodiment, the heat treatment is carried out at a temperature exceeding 700° C., preferably 800 to 1000° C. (typically 950° C.), and a processing time is made 0.1 to 6 hours, typically 0.5 to 1 hour.

In this embodiment, an example is shown in which a heat treatment is carried out in an oxygen atmosphere containing hydrogen chlorine (HCl) of 0.5 to 10 vol % (in this embodiment, 3 vol %) at 950° C. for 30 minutes. If the concentration of HCl is higher than the above-mentioned concentration, roughness comparable to a film thickness is produced on the surfaces of the active layers 409, 410 and 411. Thus, such a high concentration is not preferable.

Although an example is shown in which the HCl gas is used as a compound containing a halogen element, one kind or plural kinds of gases selected from compounds containing halogen, such as typically HF, $NF_3$, HBr, $Cl_2$, $ClF_3$, $BCl_3$, $F_2$, and $Br_2$, may be used other than the HCl gas.

In this step, it is conceivable that nickel is removed in such a manner that nickel in the active layers 409, 410 and 411 is gettered by the action of chlorine and is transformed into volatile nickel chloride which is released into the air. By this step, the concentration of nickel in the active layers 409, 410 and 411 is lowered down to $5\times10^{17}$ atoms/$cm^3$ or less.

Incidentally, the value of $5\times10^{17}$ atoms/$cm^3$ is the lower limit of detection in the SIMS (Secondary Ion Mass Spectroscopy). As a result of analysis of TFTs experimentally produced by the present inventors, when the concentration is not higher than $1\times10^{18}$ atoms/$cm^3$ (preferably $5\times10^{17}$ atoms/$cm^3$ or less), the influence of nickel upon TFT characteristics can not be seen. However, it should be noted that the concentration of an impurity in the present specification is defined as a minimum value in measurement results of the SIMS analysis.

Moreover, by the above heat treatment, a thermal oxidation reaction proceeds at the interface between the gate insulating film 412 and the active layers 409, 410 and 411, so that the thickness of the gate insulating film 412 is increased by the thickness of a thermal oxidation film. When the thermal oxidation film is formed in this way, it is possible to obtain an interface of semiconductor/insulating film which has very few interfacial levels. Moreover, there is also an effect to prevent inferior formation (edge thinning) of a thermal oxidation film at the end of the active layer.

Further, it is also effective that after the heat treatment in the above-mentioned halogen atmosphere is carried out, a heat treatment approximately at 950° C. for one hour is carried out in a nitrogen atmosphere to improve the film quality of the gate insulating film 412.

Incidentally, it is also confirmed by the SIMS analysis that the halogen element, which was used for the gettering process, having a concentration of $1\times10^{15}$ to $1\times10^{20}$ atoms/$cm^3$ remains in the active layers 409, 410 and 411. Moreover, it is confirmed by the SIMS analysis that at that time, the foregoing halogen element with a high concentration distributes between the active layers 409, 410 and 411 and the thermal oxidation film formed by the heat treatment.

As a result of the SIMS analysis for other elements, it was confirmed that the concentration of any of C (carbon), N (nitrogen), O (oxygen), and S (sulfur) as typical impurities was less than $5\times10^{18}$ atoms/$cm^3$ (typically $1\times10^{18}$ atoms/$cm^3$ or less).

Figure 5A:
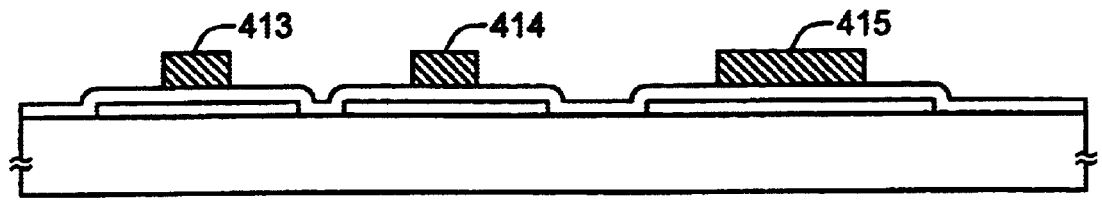
FIGS. 5A to 5D are views showing manufacturing steps of the liquid crystal display device of the present invention.

Next, reference will be made to FIGS. 5A and 5D. A not-shown metal film mainly composed of aluminum is formed, and originals 413, 414 and 415 for subsequent gate electrodes are formed by patterning. In this embodiment, the aluminum film containing scandium of 2 wt % is used (FIG. 5A). Incidentally, the original 413 subsequently becomes a floating gate of a P-channel FAMOS type TFT.

Figure 5B:
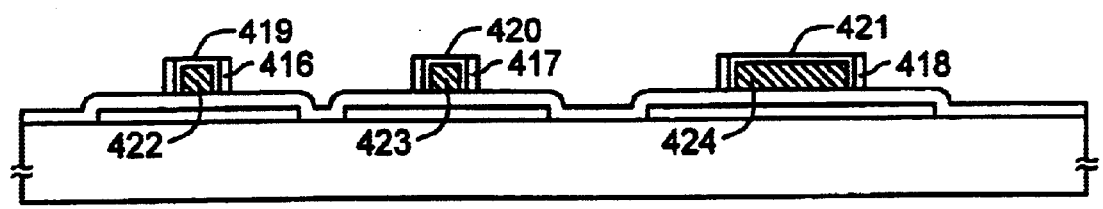
Figure 5C:
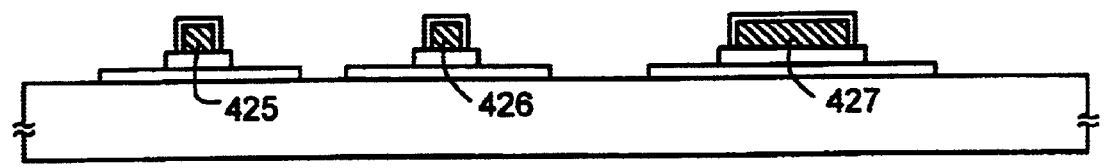
Figure 5D:
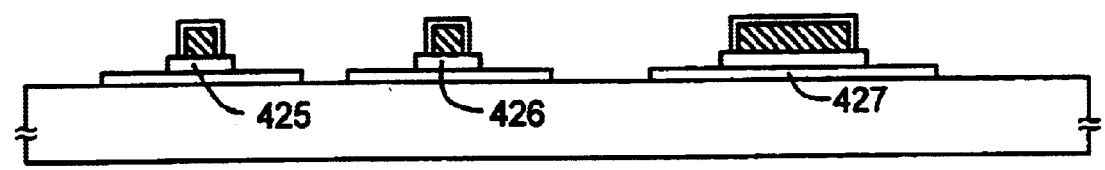

Next, by the technique disclosed in Japanese Patent Unexamined Publication No. Hei. 7-135318, porous anodic oxidation films 416, 417 and 418, nonporous anodic oxidation films 419, 420 and 421, and gate electrodes 422, 423 and 424 are formed (FIG. 5B).

After the state shown in FIG. 5B is obtained in this way, the gate insulating film 412 is next etched by using the gate electrodes 422, 423 and 424, and the porous anodic oxidation films 416, 417 and 418 as masks. Then the porous anodic oxidation films 416, 417 and 418 are removed to obtain the state shown in FIG. 5C. Incidentally, reference numerals 425, 426 and 427 in FIG. 5C denote gate insulating films after processing.

Next, the gate electrode is divided into parts to form a floating gate.

Next, reference will be made to FIGS. 6A to 6D. In the steps shown in FIGS. 6A to 6D, adding steps of impurities giving one conductivity are carried out. As the impurity element, P (phosphorus) or As (arsenic) may be used for an N type and B (boron) may be used for a P type.

In this embodiment, the addition of impurity is divided and is carried out two times. The first impurity addition (P (phosphorus) is used in this embodiment) is carried out at a high acceleration voltage of about 80 KeV to form an n⁻ region. Adjustment is made so that the concentration of p ion impurity in the n⁻ region becomes $1\times10^{18}$ to $1\times10^{19}$ atoms/cm³.

Further, the second impurity addition is carried out at a low acceleration voltage of about 10 KeV to form an n⁺ region. Since the acceleration voltage is low at this time, the gate insulating film functions as a mask. Adjustment is made so that the sheet resistance of the n⁺ region becomes 500Ω or less (preferably 300Ω or less).

Through the above described steps, a source region 428, a drain region 429, a low concentration impurity region 430, and a channel formation region 431 of the N-type TFT constituting the CMOS circuit are formed. Moreover, a source region 432, a drain region 433, a low concentration impurity region 434, and a channel formation region 435 of the N-type TFT constituting the pixel TFT are defined (FIG. 6A).

Figure 6A:
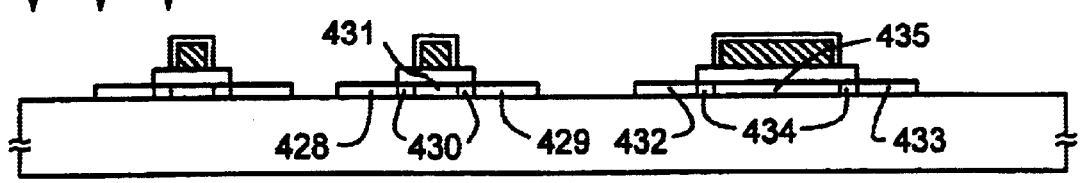
FIGS. 6A to 6D are views showing manufacturing steps of the liquid crystal display device of the present invention.

In the state shown in FIG. 6A, the active layer of the P-type TFT constituting the CMOS circuit has also the same structure as the active layer of the N-type TFT.

Figure 6B:
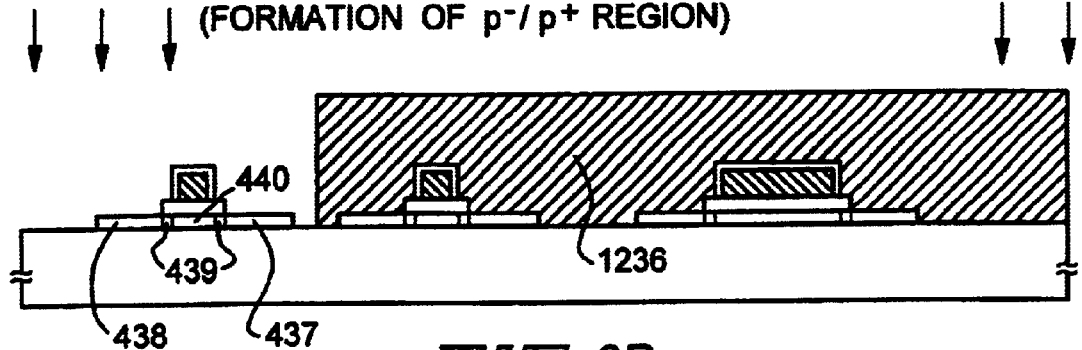

Next, as shown in FIG. 6B, a resist mask 436 covering the N type TFTs is provided, and an impurity ion for giving a P type (boron is used in this embodiment) is added.

Although this step is also divided and is carried out two times like the foregoing adding step of the impurity, since the N type must be inverted to the P type, the B (boron) ion with a concentration several times the foregoing addition concentration of the P ion is added.

In this way, a source region 437, a drain region 438, a low concentration impurity region 439, and a channel formation region 440 of the P-type TFT constituting the CMOS circuit are formed (FIG. 6B).

After the active layer is completed in the manner as described above, activation of the impurity ions is made by a combination of furnace annealing, laser annealing, lamp annealing, and the like. At the same time, damages of the active layer caused in the adding steps are also repaired.

Figure 6C:
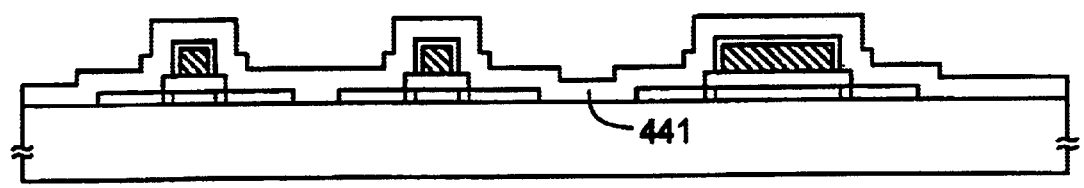
Figure 6D:
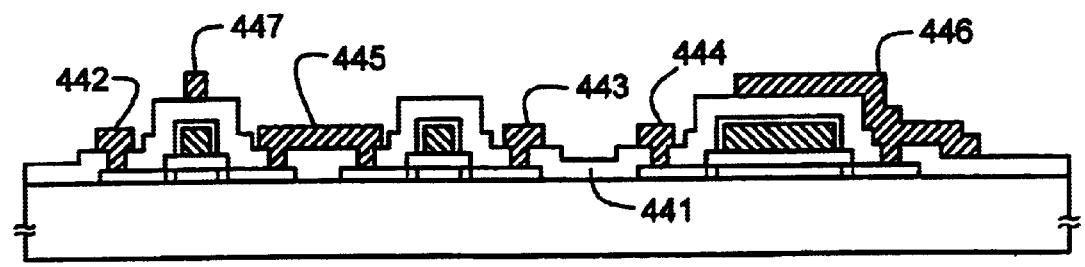

Next, as an interlayer insulating film 441, a lamination film of a silicon oxide film and a silicon nitride film is formed (FIG. 6C). Next, contact holes are formed in the interlayer insulating film 441, and then, source electrodes 442, 443 and 444, drain electrodes 445 and 446, and a gate electrode 447 are formed to obtain the state shown in FIG. 6D.

Figure 7A:
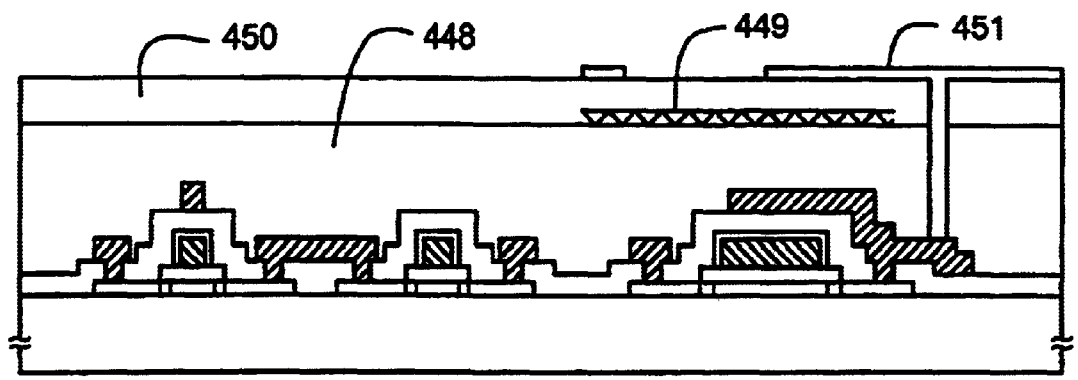
FIGS. 7A and 7B are views showing manufacturing steps of the liquid crystal display device of the present invention.

Next, reference will be made to FIGS. 7A and 7B. A second interlayer insulating film 448 made of an organic resin film and having a thickness of 0.5 to 3 μm is formed (FIG. 7A). Polyimide, acryl, polyamide, polyimide amide, or the like may be used for the organic resin film. The merits of using the organic resin film as the second interlayer insulating film 448 are listed as follow: (1) a film forming method is simple, (2) a film thickness is easily made thick, (3) parasitic capacitance can be reduced since relative dielectric constant is low, and (4) flatness is excellent.

Next, a silicon nitride film 450 with a thickness of 10 to 50 nm and a black mask 449 are formed (FIG. 7A).

Next, a third interlayer insulating film 450 made of one of a silicon oxide film, a silicon nitride film, an organic film, or a lamination film of these and having a thickness of 0.1 to 0.3 μm is formed. After a contact hole is formed in the interlayer insulating film 450, a formed conductive film is patterned to form a pixel electrode 451. Since this embodiment relates to a transmission type, a transparent conductive film such as an ITO is used as a conductive film constituting the pixel electrode 451.

In the structure shown in FIG. 7A, an auxiliary capacitance is formed in a region where the pixel electrode 451 and the black mask 449 are overlapped with each other through the interlayer insulating film 450.

In the structure as shown in FIG. 7A, it is possible to prevent lowering of an opening rate by forming the auxiliary capacitance, which is apt to occupy a wide area, over the TFT. Moreover, when a silicon nitride film having high dielectric constant and a thickness of about 25 nm is used, it is possible to secure very large capacitance with a small area.

Next, the entire of the substrate is heated in a hydrogen atmosphere at a temperature of 350° C. for 1 to 2 hours to hydrogenate the entire of the device, so that the dangling bonds (unpaired bonds) in the film (especially in the active layer) are compensated. Through the above steps, it is possible to manufacture the CMOS circuit and the pixel matrix circuit on the same substrate.

Figure 7B:
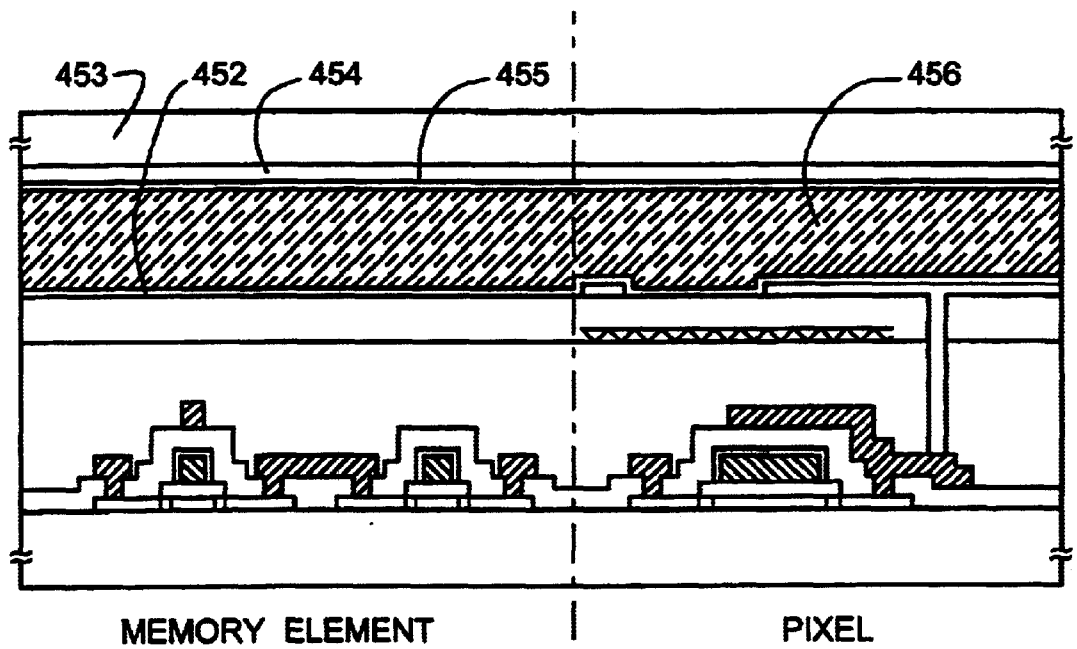

Next, as shown in FIG. 7B, a step of manufacturing a liquid crystal panel on the basis of the active matrix substrate manufactured through the above steps will be described.

An oriented film 452 is formed on the active matrix substrate in the state of FIG. 7A. In this embodiment, polyimide is used for the oriented film 452. Next, an opposite substrate is prepared. The opposite substrate is constituted by a glass substrate 453, a transparent conductive film 454, and an oriented film 455.

In this embodiment, the polyimide film in which liquid crystal molecules are oriented vertically to the substrate is used as the oriented film. Incidentally, after the oriented film is formed, a rubbing process is carried out so that the liquid crystal molecules are vertically oriented with a fixed pretilt angle.

Although a black mask, a color filter and the like are formed on the opposite substrate according to necessity, they are omitted here.

Next, the active matrix substrate and the opposite substrate obtained through the above steps are bonded to each other by known cell fabricating process through a sealing material or a spacer (not shown). Thereafter, a liquid crystal material 456 is injected between both the substrate, and is completely sealed with a sealing agent (not shown). Thus, the transmission type liquid crystal panel as shown in FIG. 7B is completed.

In this embodiment, the liquid crystal panel is designed to make display with a TN mode. Thus, a pair of polarizing plates (not shown) are disposed so that the liquid crystal panel is held between the polarizing plates in cross Nicol (state in which polarizing axes of a pair of polarizing plates are orthogonal to each other).

Thus, it is understood that in this embodiment, display is made in a normally white mode in which the liquid crystal panel is in a light state when a voltage is not applied thereto.

Figure 8:
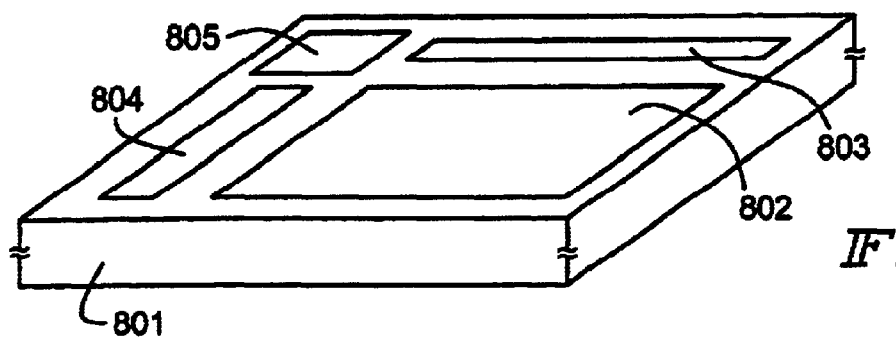
FIG. 8 is a view showing a circuit arrangement of an active matrix substrate of a liquid crystal display device of the present invention.

FIG. 8 is a view schematically showing the outer appearance of the active matrix substrate as shown in FIG. 7A. In FIG. 8, reference numeral 801 denotes a quartz substrate, 802 denotes a pixel matrix circuit, 803 denotes a source line side driver circuit, 804 denotes a gate signal line side driver circuit, and 805 denotes a logic circuit including a gamma correction control circuit and a memory for storing gamma correction data.

Although the logic circuit 805 includes all logical circuits constituted by TFTs in a wide sense, in order to distinguish the logic circuit from such a circuit as is conventionally called a pixel matrix circuit or a driver circuit, the logic circuit in the present specification indicates signal processing circuits other than such a circuit.

FIG. 16 shows a state in which a memory element including an FAMOS type TFT, a pixel TFT, and a logic circuit are integrally formed on the same substrate.

Even in the case where Si is used for a floating gate of an FAMOS type TFT used in a memory, the memory has the same structure as a peripheral circuit and a logic circuit, and the present invention can be applied to such a case.

In this embodiment, although explanation has been made to the case where the memory including the FAMOS type TFT is used, other type of TFT may be used for the memory.

An FPC (Flexible Print Circuit) terminal is attached to the liquid crystal panel formed in this way. In general, what is called a liquid crystal module is a liquid crystal panel in the state where the FPC is attached.

Figure 9A:
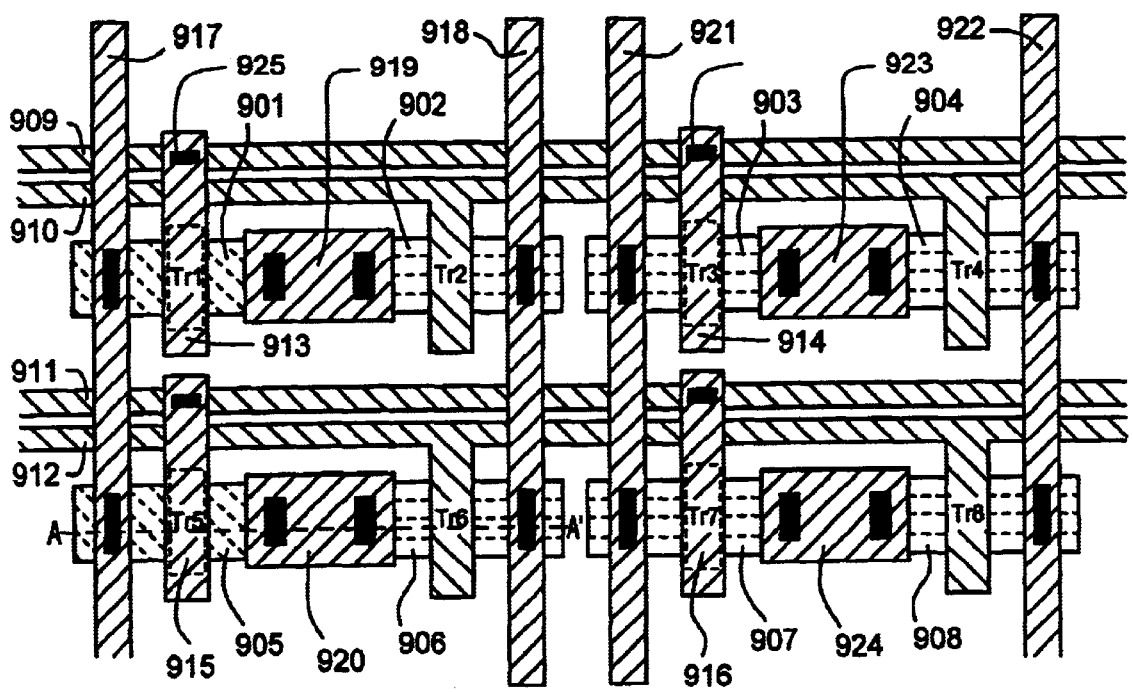
FIGS. 9A to 9C are circuit diagrams showing a memory for storing gamma correction data for a liquid crystal display device of the present invention.
Figure 9B:
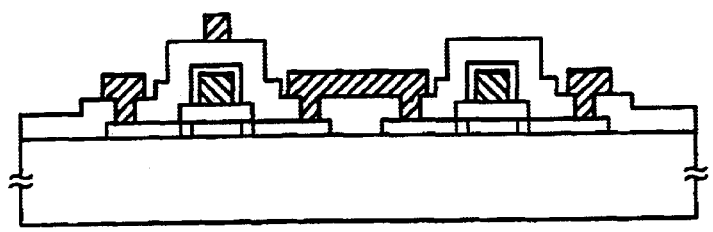
Figure 9C:
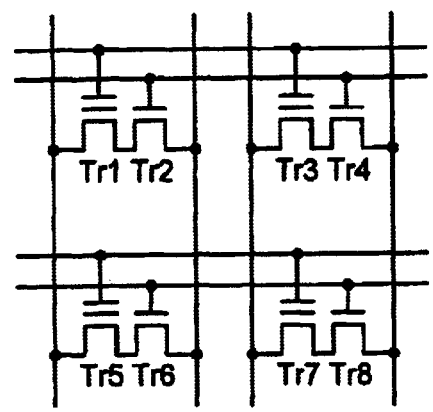

FIG. 9A is a view showing an example of a circuit of the memory 105 of this embodiment. FIG. 9A shows a circuit of four memory elements constituted by TFTs TR1 to Tr8. FIG. 9B is a sectional view taken along one-dot-chain line A–A' in FIG. 9A. FIG. 9C is an equivalent circuit of FIG. 9A.

In FIG. 9A, reference numerals 901 to 908 denote semiconductor layers which constitute TFTs Tr1 to Tr8. Reference numerals 909 to 912 denote first wiring layers, and are used as gate electrodes and wiring of gate signal lines of the TFTs Tr2, Tr4, Tr6 and Tr8. Floating gate electrodes 913 to 916 of the TFTs Tr1, Tr3, Tr5, and Tr7 are formed at the same time as the first wiring layers, and after patterning, they become floating states. Reference numerals 917 to 924 denote second wiring layers, which are used to connect the source and drain regions of each of the TFTs Tr1 and Tr2, Tr3 and Tr4, Tr5 and Tr6, and Tr7 and Tr8, or are used as signal lines connected to the source and drain regions of the respective TFTs. In the drawing, a portion which is painted black indicates that the portion is in contact with the wiring layer or semiconductor layer under the portion. Incidentally, in the drawing, the wiring having the same pattern indicates the same wiring layer.

FIG. 17 is a view showing the state where a memory having the structure shown in FIG. 9 and a CMOS circuit as a typical circuit of other logic circuits are integrally formed. Reference numeral 1701 denotes a floating gate of an FAMOS type TFT, and 1702 denotes a control gate.

Like this, in this embodiment, the gamma correction control circuit and the memory for storing gamma correction data are integrally formed on the substrate. Thus, it is possible to miniaturize the liquid crystal display device.

It is effective to add an impurity element (element in group 13, typically boron or an element in group 15, typically phosphorus) for controlling the threshold voltage (Vth) of a TFT. The amount of addition must be determined in view of Vth in the case where the above impurity for Vth control is not added.

In this embodiment, although the liquid crystal display device among semiconductor devices equipped with the memory of the present invention has been described, the FAMOS type memory of the present invention can be used for any semiconductor device which requires a memory.

Here, a semiconductor thin film manufactured by a manufacturing method of this embodiment will be described. According to the manufacturing method of this embodiment, it is possible to obtain a crystalline silicon film called by the present applicant "continuous grain boundary crystalline silicon (so-called Continuous Grain Silicon: CGS)" by crystallizing an amorphous silicon film.

The lateral growth region of a semiconductor thin film obtained by the manufacturing method of this embodiment shows a specific crystal structure composed of a collective of rod-like or flattened rod-like crystals. The features will be described below.

[Findings as to crystal structure of an active layer]

The lateral growth region formed in accordance with the foregoing manufacturing method has microscopically a crystal structure in which a plurality of rod-like (or flattened rod-like) crystals are arranged in almost parallel to each other and with regularity to a specific direction. This can be easily confirmed by observation with a TEM (Transmission Electron Microscope).

Figure 21A:
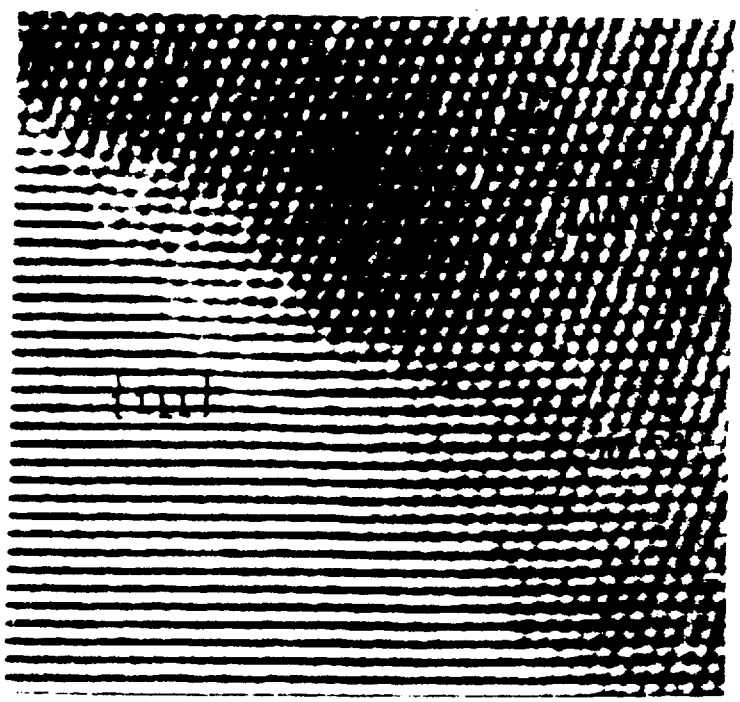
FIGS. 21A and 21B are HR-TEM photographs showing enlarged crystal grains of a semiconductor thin film.

The present inventors magnified the crystal grain boundaries of the semiconductor thin film obtained by the foregoing manufacturing method eight million times by using an HR-TEM (High Resolution Transmission Electron Microscope) and observed them in detail (FIG. 21A). In the present specification, the crystal grain boundary is defined as a grain boundary formed at an interface where different rod-like crystals are in contact with each other, unless specified otherwise. Thus, the crystal grin boundary is regarded as different from, for example, a macroscopic grain boundary formed by collision of separate lateral growth regions.

The foregoing HR-TEM (High Resolution Transmission Electron Microscope) is a method in which a sample is vertically irradiated with an electron beam and the arrangement of atoms and molecules is estimated by using interference of transmission electrons or elastically scattered electrons. By using this method, it is possible to observe the state of arrangement of crystal lattices as lattice stripes. Thus, by observing the crystal grain boundary, it is possible to infer the bonding state of atoms at the crystal grain boundary.

In the TEM photograph (FIG. 21A) obtained by the present inventors, the state where two different crystal grains (rod-like crystal grains) are in contact with each other at the crystal grain boundary is clearly observed. At this time, it is confirmed by the electron beam diffraction that the two crystal grains are almost in {110} orientation although some deviations are included in crystal axes.

In the observation of lattice stripes by the TEM photograph as described above, lattice stripes corresponding to a {111} plane are observed in the {110} plane. The lattice stripe corresponding to the {111} plane indicates such a lattice stripe that when crystal grain is cut along the lattice stripe, the {111} plane appears in the section. It is possible to simply confirm by the distance between the lattice stripes to what plane the lattice stripe corresponds.

At this time, the present inventors observed in detail the TEM photograph of the semiconductor thin film obtained through the foregoing manufacturing method, and as a result, very interesting findings were obtained. In any of the two different crystal grains seen in the photograph, lattice stripes corresponding to the {111} plane were seen. And it was observed that the lattice stripes were obviously parallel to each other.

Further, irrespective of the existence of the crystal grain boundary, lattice stripes of the two different crystal grains were connected to each other so as to cross the crystal grain boundary. That is, it was confirmed that almost all lattice stripes observed to cross the crystal grain boundary were linearly continuous in spite of the fact that they were lattice stripes of different crystal grains. This is the case with any crystal grain boundary, and 90% or more (typically 95% or more) of lattice stripes in total keep continuity at the crystal grain boundary.

Such a crystal structure (precisely the structure of crystal grain boundary) indicates that two different crystal grains are in contact with each other with excellent conformity in the crystal grain boundary. That is, crystal lattices are continuously connected to each other in the crystal grain boundary, so that such a structure is formed that trap levels caused by crystal defects or the like are not easily formed. In other words, it can be said that the crystal lattices are continuous in the crystal grain boundary.

Figure 21B:
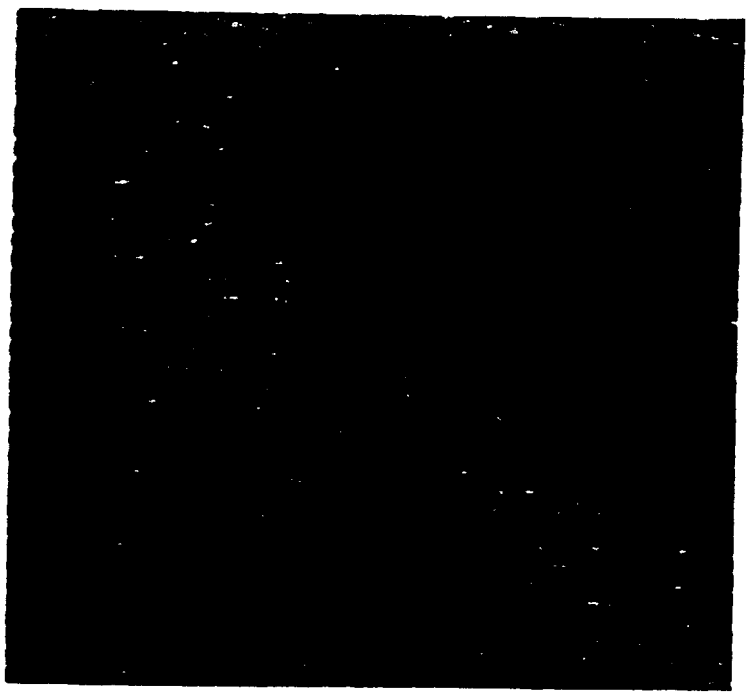

In FIG. 21B, for reference, analysis by the electron beam diffraction and HR-TEM observation was carried out by the present inventors for a conventional polycrystalline silicon film (so-called high temperature polysilicon film) as well. As a result, it was found that lattice stripes were random in the two different crystal grains and there hardly existed connection continuous in the crystal grain boundary with excellent conformity. That is, it was found that there were many portions where the lattice stripes were cut in the crystal grain boundary, and there were many crystal defects. In such portions, unpaired bonds exist, and there is a high possibility that they block the movement of carriers as trap levels.

The present inventors refer to the bonding state of atoms in the case where the lattice stripes correspond to each other with good conformity, like the semiconductor thin film obtained by the foregoing manufacturing method, as conformity bonding, and refers to a bond at that time as a conformity bond. On the contrary, the present inventors refer to the bonding state of atoms in the case where the lattice stripes do not correspond to each other with good conformity often seen in a conventional polycrystalline silicon film as unconformity bonding, and refers to a bond at that time as an unconformity bond (or unpaired bond).

Since the semiconductor thin film used in the present invention is extremely excellent in conformity at the crystal grain, the foregoing unconformity bonds are very few. As a result of study for arbitrary plural crystal grain boundaries conducted by the present inventors, the existing ratio of the unconformity bonds to the total bonds was 10% or less (preferably 5% or less, more preferably 3% or less). That is, 90% or more of the total bonds (preferably 95% or more, more preferably 97% or more) are constituted by the conformity bonds.

FIGS. 22A to 22C show results of investigation by electron beam diffraction for a crystalline silicon film formed by the manufacturing method of this embodiment. FIG. 22A shows a typical electron beam diffraction pattern of the crystalline silicon film by the manufacturing method of this embodiment, and FIG. 22B shows a typical electron beam diffraction pattern of a conventional high temperature polysilicon film for reference.

In FIGS. 22A and 22B, since measurement is made while the diameter of a radiation spot of an electron beam is made 1.35 $\mu$m, it may be considered that the information of a sufficiently macro region as compared with the level of a lattice stripe can be collected.

FIG. 22C shows an electron beam diffraction pattern in the case where an electron beam is vertically applied to the {110} plane of single crystal silicon. In general, by comparing such an electron beam diffraction pattern with an observed result, inference is made as to what is the orientation of an observed sample.

In the case of FIG. 22A, since diffraction spots as shown in FIG. 22C, which correspond to the <110> incidence, appear clearly, it can be confirmed that the crystal axis is the <110> axis (crystal plane is the {110} plane).

Although the respective spots have small concentric expanses, it is presumed that this is caused from a distribution of rotation angles of some degree. The degree of the expansion is within 5° from the evaluation of the pattern.

Among many observations, there was a case where the diffraction spots were not partially seen (a part of the diffraction spots is not seen also in FIG. 22A). It appears that although the crystal has substantially the {110} orientation, since crystal axes are slightly shifted, the diffraction pattern becomes unseen.

Based on the fact that the {111} plane is almost always included in a crystal plane, the present inventors presume that the shift of rotation angles around the <111> axis causes such a phenomenon.

On the other hand, in the case of the electron beam diffraction pattern shown in FIG. 22B, the diffraction spots do not show definite regularity, and it is confirmed that they are almost random oriented. That is, it is presumed that crystals having plane orientations other than the {110} plane are irregularly mixed.

As shown from these results, the feature of the crystalline silicon film of the present invention is that almost all crystal grains are oriented roughly in the {110} plane, and the lattice has continuity in the crystal grain boundary. These features are not seen in a conventional polysilicon film.

As described above, the semiconductor thin film manufactured by the foregoing manufacturing method is a semiconductor thin film having crystal structure (precisely structure of a crystal grain boundary) quite different from a conventional semiconductor thin film. The present inventors have explained the result of analysis as to the semiconductor thin film used in the present invention in Japanese Patent Application Nos. Hei. 9-55633, Hei. 9-165216 and Hei. 9-212428 as well.

The present inventors performed X-ray diffraction in accordance with a method disclosed in Japanese Patent Unexamined Publication No. Hei. 7-321339, and calculated the ratio of orientation with respect to the crystalline silicon film manufactured by the foregoing manufacturing method. In the publication, the ratio of orientation is defined with the calculation method as indicated by the following expression 1:

{220} orientation existence ratio=1 (constant),

{111} orientation existence ratio=(relative strength of {111} to {220} of a sample)/(relative strength of {111} to {220} of powder), {311} orientation existence ratio=(relative strength of {311} to {220} of a sample)/(relative strength of {311} to {220} of powder), and {220} orientation ratio=({220} orientation existence ratio)/({220} orientation existence ratio+{111} orientation existence ratio+{311} orientation existence ratio).

Figure 25:
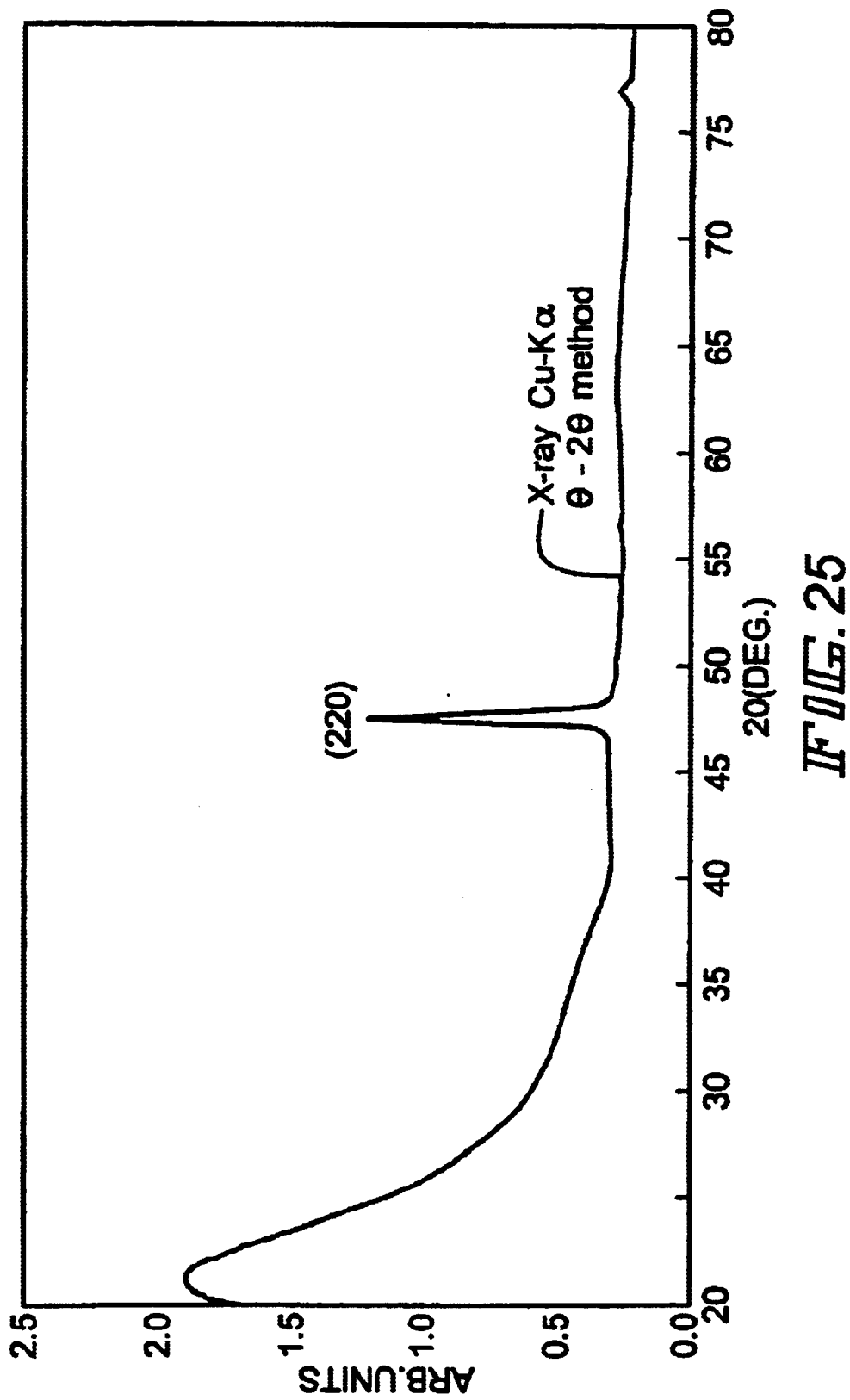
FIG. 25 is a view showing the result of X-ray diffraction.

FIG. 25 shows an example of measurement results obtained by the X-ray diffraction for the orientation of the foregoing semiconductor thin film. In the X-ray diffraction pattern, although a peak corresponding to a (220) plane appears, it is needless to say that this plane is equivalent to the {110} plane. As a result of this measurement, it has been found that the {110} plane is the main orientation, and the orientation ratio is 0.7 or more (typically 0.9 ore more).

As has been described above, it is understood that the crystalline silicon film formed by the manufacturing method of this embodiment has a crystal structure (crystal constitution) quite different from a conventional polysilicon film. Also from this point, it may be said that the crystalline silicon film of the present invention is a quite novel semiconductor film.

In the formation of the foregoing semiconductor thin film, an annealing step at a temperature above a crystallizing temperature plays an important role with respect to lowering of defects in a crystal grain. This will be described.

Figure 23A:
FIGS. 23A and 23B are TEM photographs showing crystal grains of a crystalline silicon film.

FIG. 23A is a TEM photograph of a crystalline silicon film at a time when steps up to the foregoing crystallization step have been ended, which is magnified 250 thousands times. Zigzag defects as indicated by an arrow are confirmed in the crystal grain (black portion and white portion appear due to the difference of contrast).

Although such defects are mainly lamination defects in which the order of lamination of atoms on a silicon crystal lattice plane is discrepant, there is also a case of dislocation. It appears that FIG. 23A shows a lamination defect having a defect plane parallel to the {111} plane. This can be inferred from the fact that the zigzag defects are bent at about 70°.

Figure 23B:

On the other hand, as shown in FIG. 23B, in the crystalline silicon film formed by the manufacturing method of this embodiment, which is enlarged at the same magnification, it is confirmed that there are hardly seen defects caused by lamination defects, dislocations and the like, and the crystallinity is very high. This tendency can be seen in the entire of the film surface, and although it is difficult to reduce the number of defects to zero in the present circumstances, it is possible to lower the number to substantially zero.

That is, in the crystalline silicon film shown in FIG. 23B, since defects in the crystal grain are reduced to the degree that the defects can be almost neglected, and the crystal grain boundary can not become a barrier against movement of carriers due to the high continuity, the film can be regarded as a single crystal or substantially single crystal.

Like this, in the crystalline silicon films shown in the photographs of FIGS. 23A and 23B, although the crystalline grain boundaries have almost equal continuity, there is a large difference in the number of defects in the crystal grains. The reason why the crystalline silicon film of the present invention shows electrical characteristics much higher than the crystalline silicon film shown in FIG. 23A is mainly the difference in the number of defects.

The thus obtained crystalline silicon film (FIG. 23B) according to the manufacturing method of this embodiment has the feature that the number of defects in the crystal grains is extremely smaller than the crystalline silicon film (FIG. 23A) in which merely crystallization is carried out.

The difference in the number of defects appears as the difference in spin density by the analysis of ESR (Electron Spin Resonance). In the present circumstances, it is ascertained that the spin density of the crystalline silicon film by the manufacturing method of this embodiment is at most $5 \times 10^{17}$ spins/cm$^3$ (preferably $3 \times 10^{17}$ spins/cm$^3$ or less). However, since this measurement value is near the detection limit of an existing measuring device, it is expected that the actual spin density is lower than the value.

The present applicant refers to the foregoing crystalline silicon film having the above described crystal structure and the features as a continuous grain boundary crystalline silicon (Continuous Grain Silicon: CGS).

In a conventional semiconductor thin film, although a crystal grain boundary serves as a barrier for blocking the movement of carriers, since such a crystal grain boundary does not substantially exist in the semiconductor thin film according to the manufacturing method of this embodiment, high carrier mobility can be realized. Thus, the electrical characteristics of a TFT manufactured by using the semiconductor thin film according to the manufacturing method of this embodiment show very excellent values. This will be described below.

[Findings as to electrical characteristics of a TFT]

Since the semiconductor thin film according to the manufacturing method of this embodiment can be regarded substantially as a single crystal (crystal grain boundaries do not exist substantially), a TFT using the semiconductor thin film as an active layer shows electrical characteristics comparable with a MOSFET using a single crystal silicon. Data as shown below are obtained from TFTs experimentally formed by the present inventors.

(1) The subthreshold coefficient as an index showing switching performance (promptness in switching of on/off operation) of a TFT is as small as 60 to 100 mV/decade (typically 60 to 85 mV/decade) for both an N-channel TFT and a P-channel TFT.

(2) The field effect mobility ($\mu_{FE}$) as an index showing an operation speed of a TFT is as large as 200 to 650 cm$^2$/Vs (typically 250 to 300 cm$^2$/Vs) for an N-channel TFT, and 100 to 300 cm$^2$/Vs (typically 150 to 200 cm$^2$/Vs) for a P-channel TFT.

(3) The threshold voltage ($V_{th}$) as an index indicating a driving voltage of a TFT is as small as −0.5 to 1.5 V for an N-channel TFT and −1.5 to 0.5 V for a P-channel TFT.

As described above, it is confirmed that the TFT obtained in the present invention can realize extremely superior switching characteristics and high speed operation characteristics.

Incidentally, in the formation of the CGS, the foregoing annealing step at a temperature above crystallizing temperature (700 to 1100°) plays an important role with respect to lowering of defects in the crystal grain. This will be described below.

From the above, it is understood that the gettering process of a catalytic element is an indispensable step in the formation of the CGS. The present inventors consider the following model for a phenomenon occurring in this step.

First, in the state shown in FIG. 23A, the catalytic element (typically nickel) is segregated at the defects (mainly lamination defects) in the crystal grain. That is, it is conceivable that there are many bonds having a form such as Si—Ni—Si.

However, when Ni existing in the defects is removed by carrying out the gettering process of the catalytic element, the bond of Si—Ni is cut. Thus, the remaining bond of silicon immediately forms Si—Si bond and becomes stable. In this way, the defects disappear.

Of course, it is known that the defects in a crystalline silicon film disappear by thermal annealing at a high temperature, and it is presumed that since bonds with nickel are cut and many unpaired bonds are generated, so that recombination of silicon is smoothly carried out.

The present inventors consider also a model in which the crystalline silicon film is bonded to its under layer by a heat treatment at a temperature (700 to 1100° C.) above the crystallizing temperature and adhesiveness is increased, so that the defects disappear.

[Findings as to the relation between TFT characteristics and CGS]

The above described excellent TFT characteristics depend on mainly the use of the semiconductor thin film having continuity of crystal lattices in the crystal grain boundary as an active layer of the TFT. The reason will be considered below.

The continuity of crystal lattices in the crystal grain boundary is caused from the fact that the crystal grain boundary is a grain boundary called "plane grain boundary". The definition of the plane grain boundary in the present specification is given as "Planar boundary" set forth in "Characterization of High-Efficiency Cast-Si Solar Cell Wafers by MBIC Measurement; Ryuichi Shimokawa and Yutaka Hayashi, Japanese Journal of Applied Physics vol. 27, No. 5, pp. 751–758, 1988".

According to the above paper, the planar boundary includes a {111} twin boundary, {111} lamination defect, {221} twin boundary, {221} twist boundary and the like. This planar boundary has a feature that it is electrically inactive. That is, since the boundary does not function as a trap for blocking the movement of carriers though it is a crystal grain boundary, the boundary can be regarded as substantially not existing.

Especially, the {111} twin boundary is also called a corresponding boundary of Σ3, and the {221} twin boundary is called a corresponding boundary of Σ9. The Σ value is a parameter which becomes an index showing the degree of conformity of a corresponding boundary. It is known that as the Σ value is small, the conformity of the boundary is superior.

As a result of observation of a semiconductor thin film according to the manufacturing method of this embodiment conducted by the present inventors in detail, it was found that almost all crystal grain boundaries (90% or more, typically 95% or more) are the corresponding boundaries of Σ3, that is, the {111} twin boundaries.

In the crystal grain boundary formed between two crystal grains, when the plane orientations of both crystals are {110}, and if an angle formed by lattice stripes corresponding to the {111} plane is θ, it is known that when θ is 70.5°, the boundary becomes the corresponding boundary of Σ3.

Thus, in the crystal grain boundary shown in the TEM photograph of FIG. 21A, the respective lattice stripes of adjacent crystal grains are continuous at an angle of 70°, so that it is easily presumed that this crystal grain boundary is the {111} twin boundary.

Incidentally, when θ is 38.90, the boundary becomes the corresponding boundary of Σ9. Such other crystal grain boundary also existed.

Such a corresponding boundary is formed only between crystal grains of the same plane orientation. That is, since the plane orientation of the semiconductor thin film of the present invention is uniform roughly as {110}, such a corresponding boundary can be formed over a wide range. This feature can not be obtained by other polysilicon films in which the plane orientation is irregular.

Figure 24A:
FIGS. 24A and 24B are photographs of a dark field image of a semiconductor thin film.

FIG. 24A is a TEM photograph (dark field image) of a semiconductor thin film according to the manufacturing method of this embodiment magnified 15 thousands times. Although white regions and black regions are seen in the photograph, portions of the same color have the same orientation.

The remarkable feature in FIG. 24A is that in the dark field image of such a wide range, the white regions are continuously united at a rather high rate. This means that crystal grains having the same orientation exist with some directionality, and adjacent crystal grains include almost the same orientation.

Figure 24B:

On the other hand, FIG. 24B is a TEM photograph (dark field image) in which a conventional high temperature polysilicon film is magnified 15 thousands times. In the conventional high temperature polysilicon film, portions of the same plane orientation merely exist at random, and the uniformity with directionality as shown in FIG. 24A can not be confirmed. It is conceivable that this is caused from irregularity of orientation of adjacent crystal grains.

By repeating observation and measurement over a number of regions other than the measured points shown in FIG. 21, the present inventors confirm that the continuity of the crystal lattices in the crystal grain boundary is maintained in a sufficiently wide region for manufacturing a TFT.

Embodiment 2

In this embodiment, a liquid crystal display device in which an analog picture signal supplied from an analog picture signal supply source is directly subjected to gamma correction and analog gradation can be realized, will be described.

Figure 10:
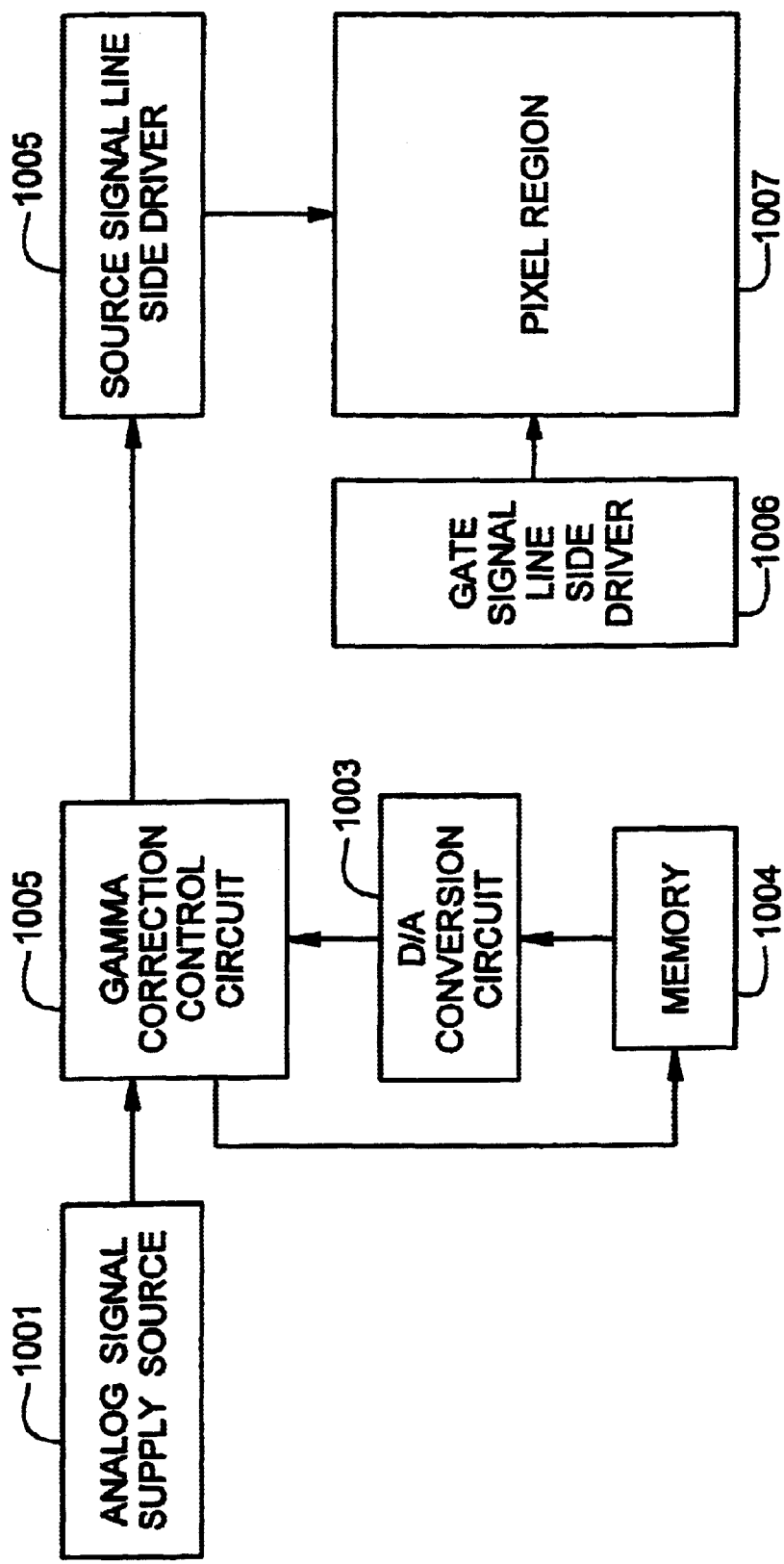
FIG. 10 is a schematic structural view of a liquid crystal display device of the present invention.

Reference will be made to FIG. 10. Reference numeral 1001 denotes an analog signal supply source for supplying an analog picture signal such as a video signal or a television signal. Reference numeral 1002 denotes a gamma correction control circuit for gamma correcting the analog signal supplied from the analog picture signal supply source 1001. Reference numeral 1003 denotes a D/A conversion circuit, and 1004 denotes a memory. The memory 1004 is similar to that in the Embodiment 1. Reference numeral 1005 denotes a source signal line side driver, and 1006 denotes a gate signal line side driver. Reference numeral 1007 denotes a pixel region which is constituted by a plurality of thin film transistors (TFTs) arranged in matrix. The pixel region 1007 is also called a pixel matrix circuit. In this embodiment, the number of pixels is made 1024×768 in length and breadth. In this embodiment, although the liquid crystal display device having the foregoing number of pixels will be described, the present invention is not limited to the liquid crystal display device having the foregoing number of pixels.

In the liquid crystal display device of this embodiment, any of the pixel region 1007, the source signal line side driver 1005, the gate signal line side driver 1006, the gamma correction control circuit 1002, the D/A conversion circuit 1003, and the memory 1004 are constituted by TFTs and are integrally formed on a substrate. The D/A conversion circuit 1003 may be mounted as an IC chip on the substrate, or may be integrally formed by TFTs on the substrate. Other peripheral circuits can be integrally formed by TFTs on the substrate. Moreover, the other peripheral circuits may be mounted as an IC chip on the substrate.

An analog picture signal supplied from the analog picture signal supply source 1001 is supplied to the gamma correction control circuit 1002. The memory 1004 is a 4-bit memory and 1003 is an A/D conversion circuit. The gamma correction control circuit 1002 corrects the analog picture signal supplied from the analog picture signal supply source 1001 based on the gamma correction data stored in the memory 1004, and transmits the corrected signal to the source signal line side driver 1005. The data for gamma correction stored in the memory 1004 are converted into analog signals by the D/A conversion circuit 1003, and are transmitted to the gamma correction control circuit 1002.

In the gamma correction control circuit 1002, an analog signal is processed and a picture signal is subjected to gamma correction, and the analog picture signal subjected to the gamma correction is supplied to the source signal line side driver.

The analog signal supplied to the source signal line side driver is selected by a signal from a shift register of the source signal line side driver and is supplied to a source signal line. Then, according to a signal from a shift register of the gate signal line side driver, a desired pixel is turn on.

In this embodiment, the source signal line side driver 1005, the gate signal line side driver 1006, the pixel matrix circuit (pixel region) 1007, the gamma correction control circuit 1002, the D/A conversion circuit 1003, and the memory 1004 are integrally formed by TFTs on the substrate. The D/A conversion circuit 1003 may be mounted on the substrate by means of an IC chip including the D/A conversion circuit. Moreover, according to necessity, other peripheral circuits are integrally formed. Further, according to necessity, an IC chip including other peripheral circuits is mounted on the substrate.

Incidentally, the liquid crystal display device of this embodiment can also be manufactured by the manufacturing method of the embodiment 1.

In this embodiment, among the semiconductor devices equipped with the memory of the present invention, although the liquid crystal display device has been especially described, the FAMOS type TFT memory of the present invention may be used in any semiconductor device requiring a memory.

Embodiment 3

In this embodiment, other embodiment of a liquid crystal display device of digital gradation will be described.

Figure 11:
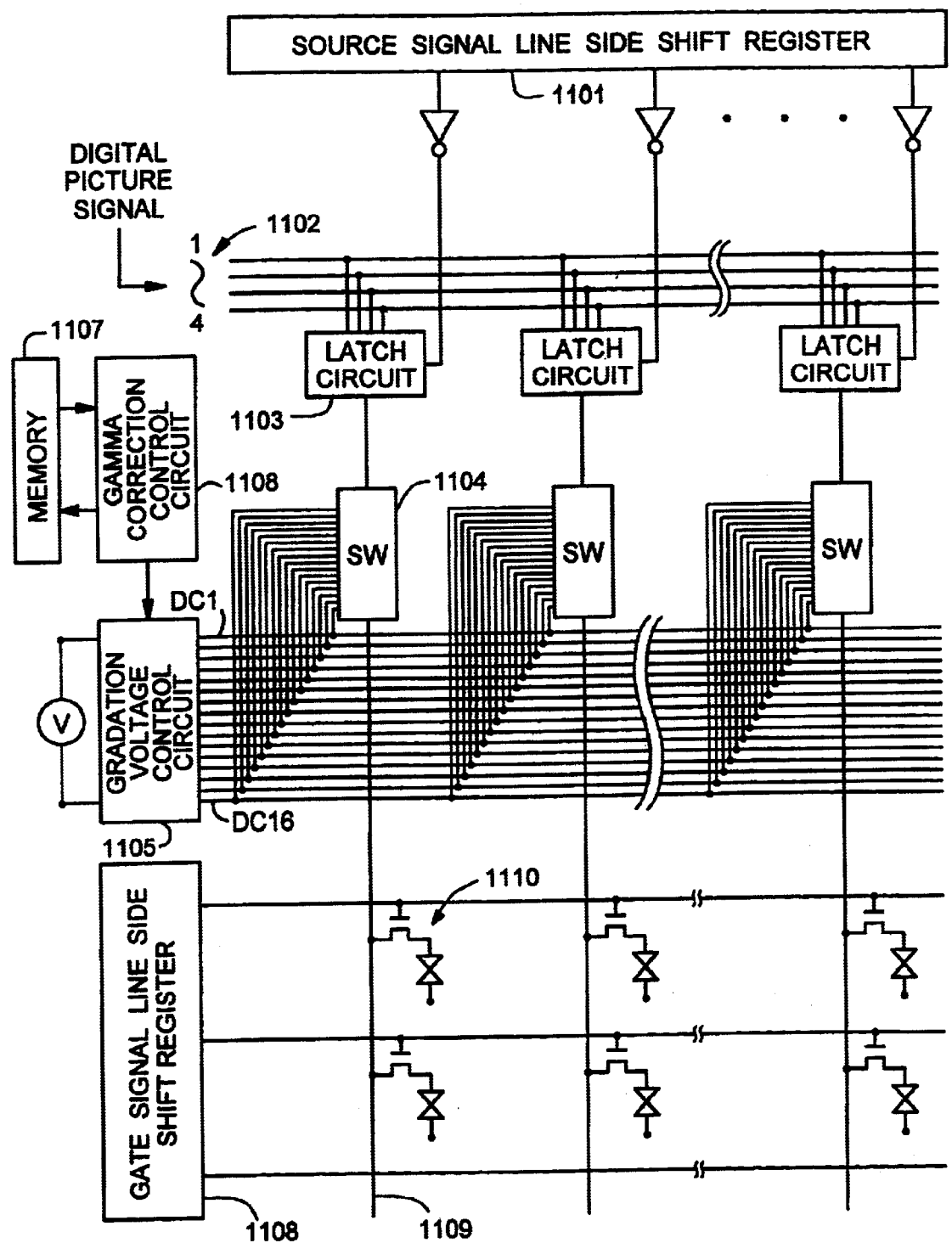
FIG. 11 is a schematic structural view of a liquid crystal display device of the present invention.

Reference will be made to FIG. 11. FIG. 11 shows a source signal line side driver, a gate signal line side driver, a pixel region, a gamma correction control circuit, and a memory of a liquid crystal display device of this embodiment. Reference numeral 1101 denotes a source signal line side shift register, and 1102 denotes a signal line for supplying a digital signal inputted to the source signal line side driver. In this embodiment, in order to carry out 16-gradation display, this signal line is designed to be able to treat 4-bit data. Reference numeral 1103 denotes latch circuits each of which selects a signal supplied to the signal line 1102 by a signal from the source signal line side shift register 1101 and temporarily stores the selected signal. Reference numeral 1104 denotes switching circuits each of which, in accordance with a signal supplied from each of the latch circuits 1103, selects any one of voltage lines DC1 to DC16 in which a voltage is adjusted by a gradation voltage control circuit 1105, and supplies to a source signal line 1109. After picture information corresponding to one line is stored in the group of the latch circuits 1103, the picture information stored in the group of the latch circuits 1103 is transmitted to the switching circuits 1104 at the same time.

A corresponding pixel TFT 1110 is selected by a signal voltage corresponding to a designated gradation supplied to the source signal line and a signal from a gate signal line side shift register 1108. In this way, the picture information corresponding to the designated gradation is written into the respective pixels.

In this embodiment, the digital signal supplied to the signal line 1102 is not subjected to gamma correction. In this embodiment, equal voltages are not applied to the respective voltage lines DC1 to DC16 to be selected by the switching circuits 1104, but it is designed so that the voltage lines are nonlinearly applied with voltages. By doing so, the picture signal can be subjected to gamma correction.

Figure 12:
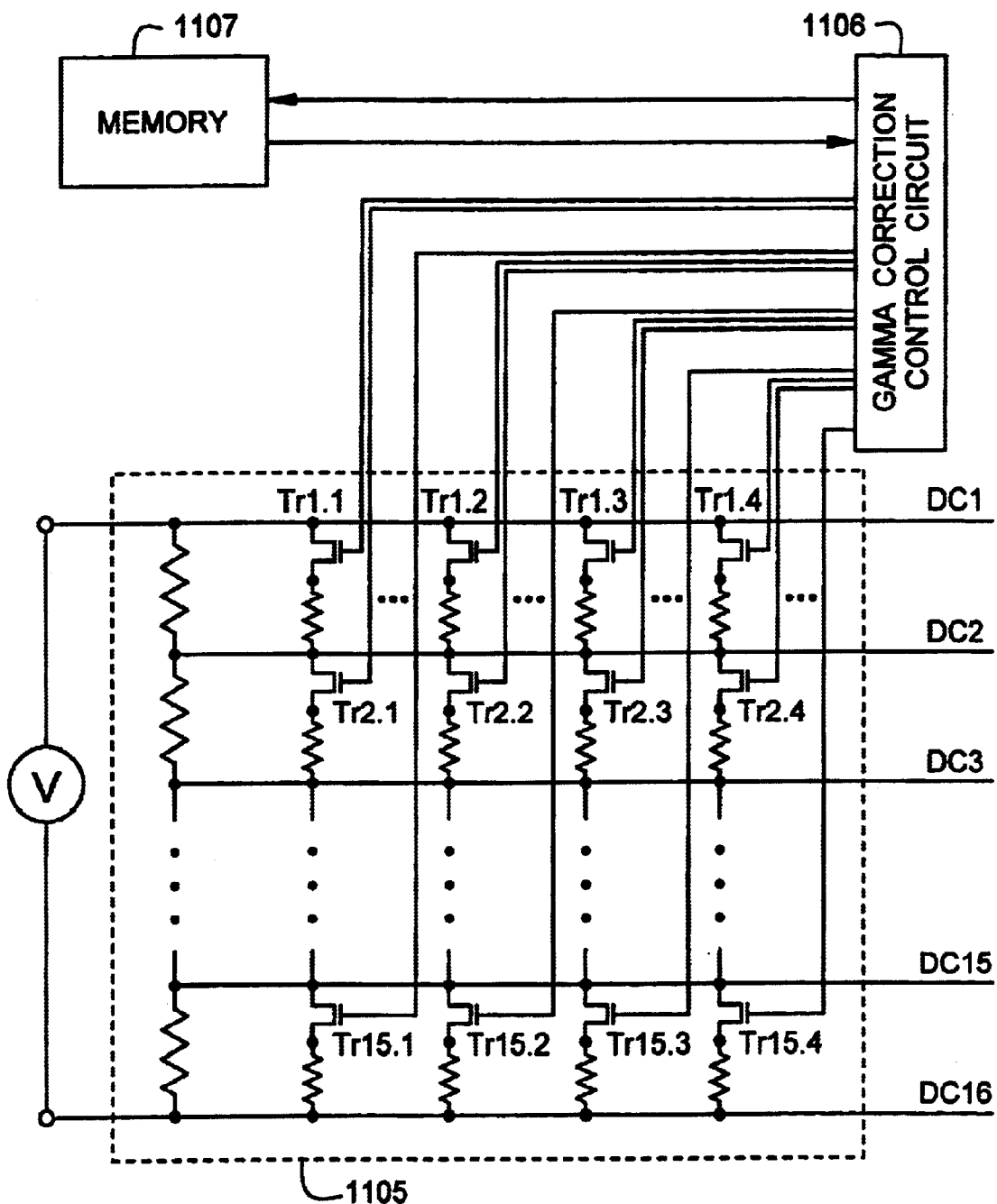
FIG. 12 is a view showing voltage lines of a liquid crystal display device of the present invention and a circuit for carrying out gamma correction.

Reference will be made to FIG. 12. FIG. 12 shows a gamma correction circuit in this embodiment. Reference numeral 1106 denotes a gamma correction control circuit, which switches TFTs Tr1.1 to Tr15.4 of the gradation voltage control circuit 1105 based on data from a memory 1107, which stores the data for gamma correction, to adjust voltage applied to the voltage lines DC1 to DC16.

The gradation voltage control circuit 1105 is constituted by a plurality of TFTs Tr1.1 to Tr15.4 and a plurality of resistors connected to the voltage lines DC1 to DC16, and it is designed so that according to a TFT selected by the gamma correction control circuit, voltage applied to the voltage lines DC1 to DC16 is subjected to gamma correction.

The data for gamma correction are stored in the memory 1107, and according to the supplied digital picture signal, necessary data are read. A memory similar to one used in the embodiment 1 is used for the memory 1107.

Figure 13:
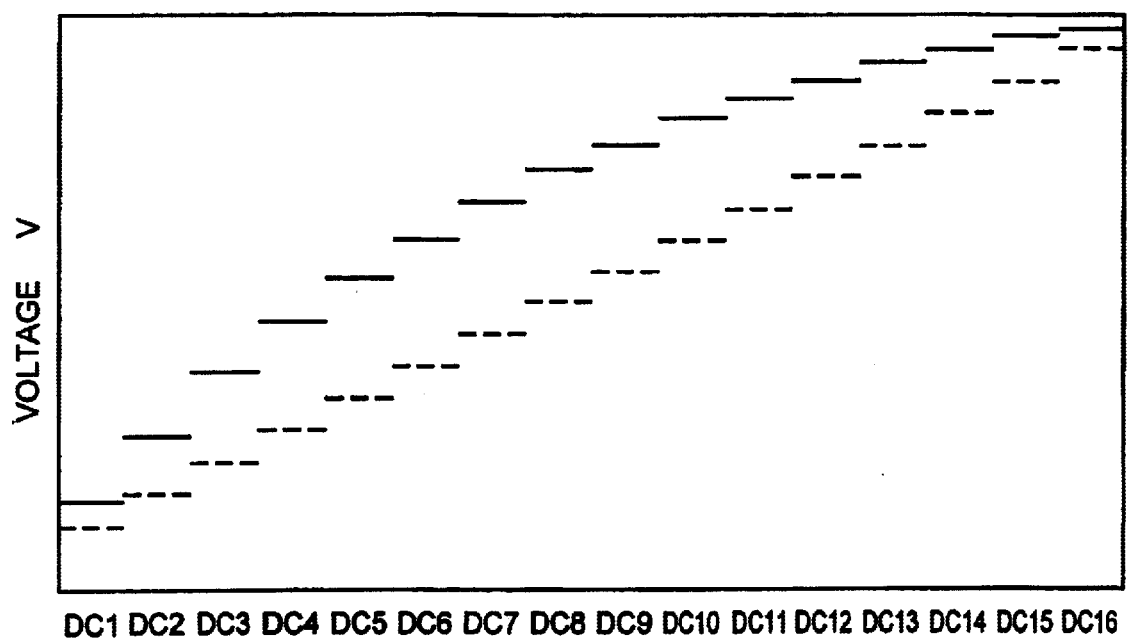
FIG. 13 is a view showing effects of the gamma correction of the present invention.
Figure 14:
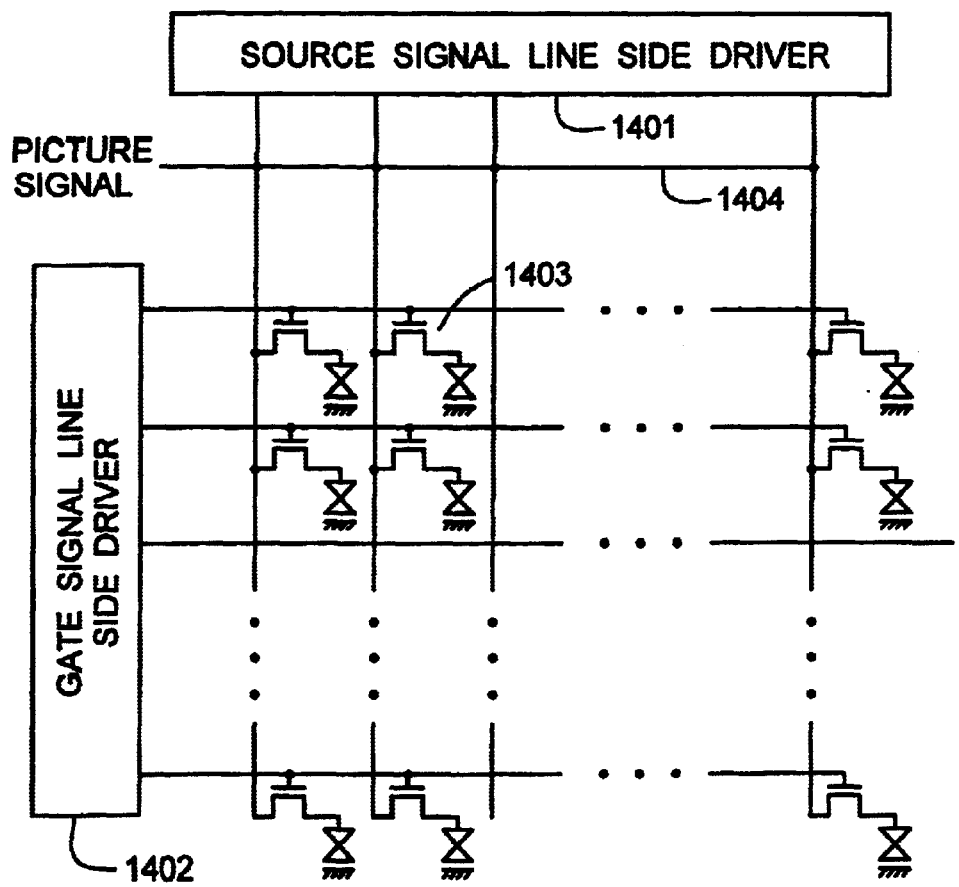
FIG. 14 is a schematic structural view showing a conventional liquid crystal display device.
Figure 15:
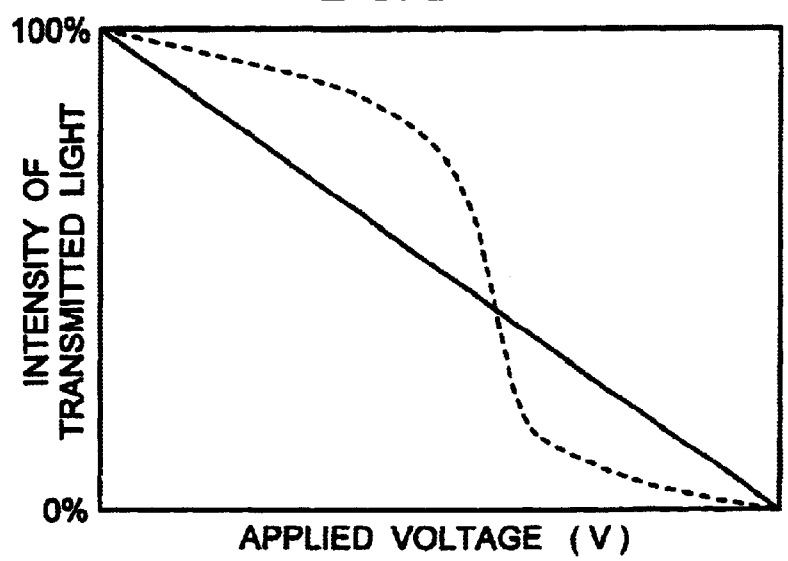
FIG. 15 is a view for explaining the gamma correction.

Reference will be made to FIG. 13. FIG. 13 shows an example of a state of voltages applied to the voltage lines DC1 to DC16 used in this embodiment. The vertical axis indicates voltage (V). What are indicated by dotted lines are voltages before gamma correction, and what are indicated by solid lines are voltages after gamma correction.

In this embodiment, gamma correction is performed to the gradation voltage applied to the voltage lines DC1 to DC16, so that the voltage line selected by the switching circuit 1104 according to the digital picture signal can supply a desired gradation voltage to the source signal line.

Although the memory 1107 of this embodiment stores data for gamma correction, the data are stored by the method described in the embodiment 1. In this embodiment as well, peripheral circuits such as the memory, gamma correction control circuit, and gradation voltage control circuit are integrally formed on the substrate at the same time as TFTs arranged in matrix in the pixel region and TFTs constituting the driver circuit. The manufacturing method may be the method described in the embodiment 1.

In this embodiment, among semiconductor devices equipped with the memory of the present invention, although the liquid crystal display device has been especially described, the FAMOS type TFT memory of the present invention may be used in any semiconductor device requiring a memory.

Embodiment 4

The liquid crystal display device used in the above embodiments may be included and used in a projection type liquid crystal display device. Also in this case, it is possible to miniaturize the device and to make excellent gradation display.

In this embodiment, among semiconductor devices equipped with the memory of the present invention, although the projection type liquid crystal display device has been especially described, the FAMOS type TFT memory of the present invention may be used in any semiconductor device requiring a memory.

Embodiment 5

In the foregoing embodiments 1 to 4, although explanation has been made to cases where a liquid crystal is used as a display medium, a mixed layer of a liquid crystal and a high polymer may also be used for the semiconductor display device of the present invention to make a so-called polymer dispersion type liquid crystal display device. Moreover, the present invention may be used for a display device equipped with any display medium in which the optical characteristics can be modulated in response to an applied voltage. For example, the present invention may be applied to a display device equipped with an electroluminescence element as a display medium. Also in this case, the steps described in the embodiment 1 are used for manufacturing of an active matrix substrate including a memory, a peripheral circuit and the like.

In this embodiment, among semiconductor devices equipped with the memory of the present invention, although the display device has been especially described, the FAMOS type TFT memory of the present invention may be used in any semiconductor device requiring a memory.

Embodiment 6

The semiconductor device or semiconductor display device constituted by the nonvolatile memory and the gamma correction circuit of the embodiment 1, 2, 3 and 5 have various uses. In this embodiment, these semiconductor devices will be described.

As such semiconductor devices, a video camera, a still camera, a projector, a head mount display, a car navigation system, a personal computer, a portable information terminal (mobile computer, portable telephone, etc.) and the like are enumerated. FIGS. 18A to 18E shows examples of these semiconductor devices.

Figure 18A:
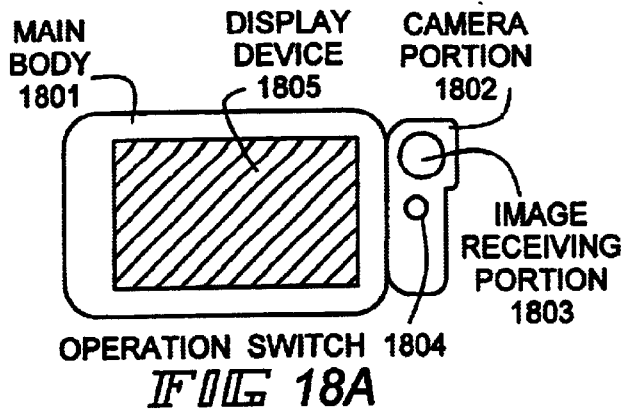
FIGS. 18A to 18E are schematic views of semiconductor devices using a liquid crystal display device of the present invention.

FIG. 18A shows a mobile computer which is constituted by a main body 1801, a camera portion 1802, an image receiving portion 1803, an operation switch 1804, and a display device 1805.

Figure 18B:
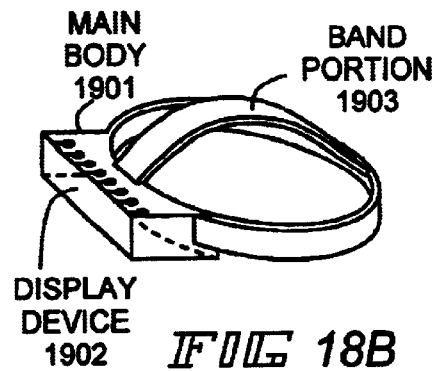

FIG. 18B shows a head mount display which is constituted by a main body 1901, a display device 1902, and a band portion 1903.

Figure 18C:
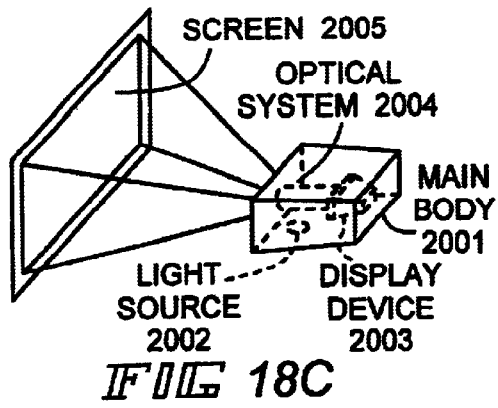

FIG. 18C shows a front type projector which is constituted by a main body 2001, a light source 2002, a display device 2003, an optical system 2004, and a screen 2005.

Figure 18D:
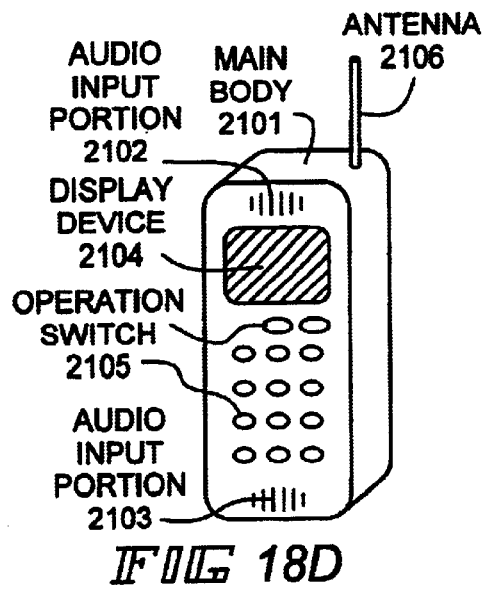

FIG. 18D shows a portable telephone which is constituted by a main body 2101, an audio output portion 2102, an audio input portion 2103, a display device 2104, an operation switch 2105, and an antenna 2106.

Figure 18E:
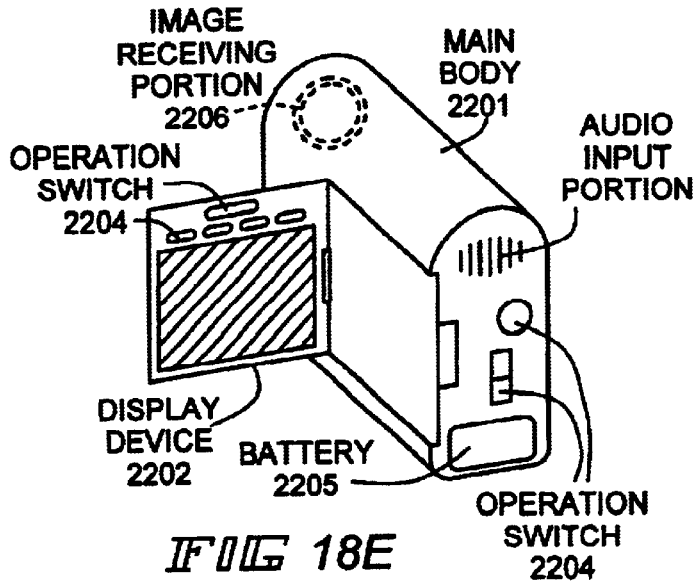

FIG. 18E shows a video camera which is constituted by a main body 2201, a display device 2202, an audio input portion 2203, an operation switch 2204, a battery 2205, and an image receiving portion 2206.

Embodiment 7

In this embodiment, in the manufacturing steps described in the embodiment 1, a case where Ta (tantalum) or Ta alloy is used for the gate electrode will be described.

If Ta or Ta alloy is used for the gate electrode, it is possible to carry out thermal oxidation at about 450° C. to about 600° C., so that an oxide film having excellent film quality, such as a $Ta_2O_3$ film, is formed on the gate electrode. It is known that this oxide film has a film quality better than that of the oxide film formed when Al (aluminum) is used for the gate electrode as described in the above embodiment 1.

This has been found from the fact that in the J-E characteristics (current density-electric field strength characteristics) which is one of withstand voltage estimations of an insulating film, the oxide film of Ta or Ta alloy has characteristics superior to the oxide film of Al.

Since $Ta_2O_3$ has a specific dielectric constant of about 11.6, and capacitance C3 (see the expression 1 in the embodiment 1) between the floating gate and control gate is large, there is also such a merit that an electric charge is more easily injected to the floating gate as compared with the case where Al is used for the gate electrode.

Moreover, in the case where Ta is used for the gate electrode, it is also possible to carry out anodic oxidation as in the above embodiment.

Incidentally, in the semiconductor devices of the foregoing embodiments 1 to 6, Ta or Ta alloy may be used for the gate electrode.

According to the present invention, in a semiconductor device requiring a memory, it is possible to easily manufacture an FAMOS type TFT memory without increasing steps, so that it is possible to increase the performance of the semiconductor device and to miniaturize the semiconductor device.

Moreover, according to the present invention, since an arithmetic circuit for carrying out gamma correction and a memory for storing data used in the gamma correction are integrally formed concurrently with a pixel TFT, a driver circuit, and other peripheral circuits, it is possible to realize a liquid crystal display device having excellent gradation display while the liquid crystal display device can be miniaturized.

What is claimed is:

1. A semiconductor device comprising:
   a memory for storing data; and
   a logic circuit for controlling the data,
   wherein the memory and the logic circuit are constituted by TFTs, and are integrally disposed over a same insulating substrate, and
   wherein an active layer of each of the TFTs has a thickness of 10 to 100 nm.

2. A device according to claim 1, wherein the memory is a nonvolatile memory.

3. A device according to claim 1 wherein an active layer of each of the TFTs contains an element selected from the group consisting of carbon, nitrogen, oxygen and sulphur, and concentration of the element therein is less than $5 \times 10^{18}$ atoms/cm$^3$.

4. A device according to claim 1 wherein the semiconductor device is a mobile computer, a head mount display, a front type projector, a portable telephone, or a video camera.

5. A semiconductor device comprising:
   a control circuit for carrying out gamma correction of a supplied signal; and
   a memory for storing data used in the gamma correction,
   wherein the control circuit and the memory are constituted by TFTs, and are integrally disposed over a same insulating substrate.

6. A device according to claim 5, wherein the memory is a nonvolatile memory.

7. A device according to claim 5 wherein an active layer of each of the TFTs contains an element selected from the group consisting of carbon, nitrogen, oxygen and sulphur, and concentration of the element therein is less than $5 \times 10^{18}$ atoms/cm$^3$.

8. A device according to claim 5, wherein the signal is a digital signal.

9. A device according to claim 5, wherein the signal is an analog signal, and the semiconductor device further comprises a conversion circuit for converting the analog signal to a digital signal.

10. A device according to claim 5 wherein the semiconductor device is a mobile computer, a head mount display, a front type projector, a portable telephone, or a video camera.

11. A semiconductor device comprising:
   a memory comprising a first thin film transistor for storing data; and
   a logic circuit comprising a second thin film transistor for controlling the data,
   wherein the memory and the logic circuit are integrally disposed over a same insulating substrate,
   wherein each of the first thin film transistor of the memory and the second thin film transistor of the logic circuit comprises:
   a source region and a drain region;
   a channel formation region provided between the source region and the drain region;
   a gate electrode provided adjacent to the channel formation region with a gate insulating film therebetween,
   wherein the first thin film transistor of the memory has a first semiconductor layer comprising the source region and the drain region and the channel formation region thereof, and the second thin film transistor of the logic circuit has a second semiconductor layer of the same layer as the first semiconductor layer, said second semiconductor layer comprising the source region and the drain region and the channel formation region of the second thin film transistor, and wherein the first semiconductor layer comprises crystal grains mainly oriented in {110} plane.

12. A device according to claim 11, wherein the memory is a nonvolatile memory.

13. A device according to claim 11 wherein the first and second semiconductor layers contain an element selected from the group consisting of carbon, nitrogen, oxygen and sulphur, and concentration of the element therein is less than 5×10$^{18}$ atoms/cm$^3$.

14. A device according to claim 11, wherein the first and second semiconductor layers have a thickness of 10 to 100 nm.

15. A device according to claim 11 wherein the semiconductor device is a mobile computer, a head mount display, a front type projector, a portable telephone, or a video camera.

16. A semiconductor device comprising:

a control circuit comprising a first thin film transistor for carrying out gamma correction of a supplied signal; and a memory comprising a second thin film transistor for storing data used in the gamma correction, wherein the control circuit and the memory are integrally disposed over a same insulating substrate, wherein each of the first thin film transistor of the control circuit and the second thin film transistor of the memory comprises:

a source region and a drain region;

a channel formation region provided between the source region and the drain region, a gate electrode provided adjacent to the channel formation region with a gate insulating film therebetween, wherein the first thin film transistor of the control circuit has a first semiconductor layer comprising the source region and the drain region and the channel formation region thereof, and the second thin film transistor of the memory has a second semiconductor layer of the same layer as the first semiconductor layer, said second semiconductor layer comprising the source region and the drain region and the channel formation region of the second thin film transistor, and wherein the first semiconductor layer comprises crystal grains mainly oriented in {110} plane.

17. A device according to claim 16, wherein the memory is a nonvolatile memory.

18. A device according to claim 16 wherein the first and second semiconductor layers contain an element selected from the group consisting of carbon, nitrogen, oxygen and sulphur, and concentration of the element therein in less than 5×10$^{18}$ atoms/cm$^3$.

19. A device according to claim 16, wherein the signal is a digital signal.

20. A device according to claim 16 wherein the semiconductor device is a mobile computer, a head mount display, a front type projector, a portable telephone, or a video camera.

21. A semiconductor device comprising:

a memory comprising a first thin film transistor for storing data; and a logic circuit comprising a second thin film transistor for controlling the data, wherein the memory and the logic circuit are integrally disposed over a same insulating substrate, wherein each of the first thin film transistor of the memory and the second thin film transistor of the logic circuit comprises:

a source region and a drain region;

a channel formation region provided between the source region and the drain region;

a gate electrode provided adjacent to the channel formation region with a gate insulating film therebetween, wherein the first thin film transistor of the memory has a first semiconductor layer comprising the source region and the drain region and the channel formation region thereof, and the second thin film transistor of the logic circuit has a second semiconductor layer of the same layer as the first semiconductor layer, said second semiconductor layer comprising the source region and the drain region and the channel formation region of the second thin film transistor, and wherein the second semiconductor layer comprises crystal grains mainly oriented in {110} plane.

22. A device according to claim 21, wherein the memory is a nonvolatile memory.

23. A device according to claim 21 wherein the first and second semiconductor layers contain an element selected from the group consisting of carbon, nitrogen, oxygen and sulphur, and concentration of the element therein is less than 5×10$^{18}$ atmos/cm$^3$.

24. A device according to claim 21, wherein the first and second semiconductor layers have a thickness of 10 to 100 nm.

25. A device according to claim 21 wherein the semiconductor device is a mobile computer, a head mount display, a front type projector, a portable telephone, or a video camera.

26. A semiconductor device comprising:

a control circuit comprising a first thin film transistor for carrying out gamma correction of a supplied signal; and a memory comprising a second thin film transistor for storing data used in the gamma correction, wherein the control circuit and the memory are integrally disposed over a same insulating substrate, wherein each of the first thin film transistor of the control circuit and the second thin film transistor of the memory comprises:

a source region and a drain region;

a channel formation region provided between the source region and the drain region;

a gate electrode provided adjacent to the channel formation region with a gate insulating film therebetween, wherein the first thin film transistor of the control circuit has a first semiconductor layer comprising the source region and the drain region and the channel formation region thereof, and the second thin film transistor of the memory has a second semiconductor layer, said second semiconductor layer comprising the source region and the drain region and the channel formation region of the second thin film transistor, and wherein the second semiconductor layer comprises crystal grains mainly oriented in {110} plane.

27. A device according to claim 26, wherein the memory is a nonvolatile memory.

28. A device according to claim 26 wherein the first and second semiconductor layers contain an element selected from the group consisting of carbon, nitrogen, oxygen and sulphur, and concentration of the element therein is less than 5×10$^{18}$ atoms/cm$^3$.

29. A device according to claim 26, wherein the signal is a digital signal.

30. A device according to claim 26 wherein the semiconductor device is a mobile computer, a head mount display, a front type projector, a portable telephone, or a video camera.

31. A semiconductor device comprising:
a memory comprising a first thin film transistor for storing data; and
a logic circuit comprising a second thin film transistor for controlling the data,
wherein the memory and the logic circuit are integrally disposed over a same insulating substrate,
wherein each of the first thin film transistor of the memory and the second thin film transistor of the logic circuit comprises:
a source region and a drain region;
a channel formation region provided between the source region and the drain region;
a gate electrode provided adjacent to the channel formation region with a gate insulating film therebetween,
wherein the first thin film transistor of the memory has a first semiconductor layer comprising the source region and the drain region and the channel formation region thereof, and the second thin film transistor of the logic circuit has a second semiconductor layer of the same layer as the first semiconductor layer, said second semiconductor layer comprising the source region and the drain region and the channel formation region of the second thin film transistor, and
wherein the first and second semiconductor layers comprise crystal grains mainly oriented in {110} plane.

32. A device according to claim 31, wherein the memory is a nonvolatile memory.

33. A device according to claim 31 wherein the first and second semiconductor layers contain an element selected from the group consisting of carbon, nitrogen, oxygen and sulphur, and concentration of the element therein is less than $5 \times 10^{18}$ atoms/cm$^3$.

34. A device according to claim 31, wherein the first and second semiconductor layers have a thickness of 10 to 100 nm.

35. A device according to claim 31 wherein the semiconductor device is a mobile computer, a head mount display, a front type projector, a portable telephone, or a video camera.

36. A semiconductor device comprising:
a control circuit comprising a first thin film transistor for carrying out gamma correction of a supplied signal; and
a memory comprising a second thin film transistor for storing data used in the gamma correction,
wherein the control circuit and the memory are integrally disposed over a same insulating substrate,
wherein each of the first thin film transistor of the control circuit and the second thin film transistor of the memory comprises:
a source region and a drain region;
a channel formation region provided between the source region and the drain region;
a gate electrode provided adjacent to the channel formation region with a gate insulating film therebetween,
wherein the first thin film transistor of the control circuit has a first semiconductor layer comprising the source region and the drain region and the channel formation region thereof, and the second thin film transistor of the memory has a second semiconductor layer of the same layer as the first semiconductor layer, said second semiconductor layer comprising the source region and the drain region and the channel formation region of the second thin film transistor, and
wherein the first and second semiconductor layers comprise crystal grains mainly oriented in {110} plane.

37. A device according to claim 36, wherein the memory is a nonvolatile memory.

38. A device according to claim 36 wherein the first and second semiconductor layers contain an element selected from the group consisting of carbon, nitrogen, oxygen and sulphur, and concentration of the element therein is less than $5 \times 10^{18}$ atoms/cm$^3$.

39. A device according to claim 36, wherein the signal is a digital signal.

40. A device according to claim 36 wherein the semiconductor device is a mobile computer, a head mount display, a front type projector, a portable telephone, or a video camera.

41. A semiconductor device comprising:
a memory comprising a first thin film transistor for storing data for gamma correction;
a gradation voltage control circuit comprising a resistor and a second thin film transistor;
a control circuit comprising a third thin film transistor for controlling a gate voltage of the second thin film transistor to cause the second thin film transistor to output a voltage according to the gamma correction; and
a plurality of voltage lines having output voltages of the gradation voltage control circuit according to the gamma correction,
wherein the first thin film transistor of the memory, the second thin film transistor of the gradation voltage control circuit and the third thin film transistor of the control circuit are integrally disposed over a same insulating substrate.

42. A device according to claim 41 wherein the semiconductor device is a mobile computer, a head mount display, a front type projector, a portable telephone, or a video camera.

43. A semiconductor device comprising:
a control circuit comprising a first thin film transistor for carrying out gamma correction of a supplied signal; and
a memory comprising a second thin film transistor for storing data used in the gamma correction,
wherein the control circuit and the memory are integrally disposed over a same insulating substrate,
wherein each of the first thin film transistor of the control circuit and the second thin film transistor of the memory comprises:
a source region and a drain region;
a channel formation region provided between the source region and the drain region;
a low concentration impurity region provided between the channel formation region and at least one of the source region and the drain region; and
a gate electrode provided adjacent to the channel formation region with a gate insulating film therebetween,
wherein the first thin film transistor of the control circuit has a first semiconductor layer comprising the source region and the drain region and the channel formation region thereof, and the second thin film transistor of the memory has a second semiconductor layer of the same layer as the first semiconductor layer, said second semiconductor layer comprising the source region and the drain region and the channel formation region of the second thin film transistor, and wherein the first semiconductor layer comprises crystal grains mainly oriented in {110} plane.

44. A device according to claim 43, wherein the memory is a nonvolatile memory.

45. A device according to claim 43 wherein the first and second semiconductor layers contain an element selected from the group consisting of carbon, nitrogen, oxygen and sulphur, and concentration of the element therein is less than $5 \times 10^{18}$ atoms/cm$^3$.

46. A device according to claim 43, wherein the signal is a digital signal.

47. A device according to claim 43 wherein the semiconductor device is a mobile computer, a head mount display, a front type projector, a portable telephone, or a video camera.

48. A semiconductor device comprising:

a memory for storing data; and a logic circuit for controlling the data, wherein the memory and the logic circuit are constituted by TFTs, and are integrally disposed over a same insulating substrate, and wherein an active layer of each of the TFTs contains an element selected from the group consisting of carbon, nitrogen, oxygen and sulphur, and concentration of the element therein is less than $5 \times 10^{18}$ atoms/cm$^3$.

* * * * *